United States Patent
Jun et al.

(10) Patent No.: US 9,589,899 B2
(45) Date of Patent: Mar. 7, 2017

(54) SEMICONDUCTOR DEVICE HAVING A GATE CUTTING REGION AND A CROSS-COUPLING PATTERN BETWEEN GATE STRUCTURES

(71) Applicants: Hwi-Chan Jun, Yongin-si (KR); Dae-Hee Weon, Seongnam-si (KR); Heon-Jong Shin, Yongin-si (KR); Yu-Sun Lee, Seoul (KR)

(72) Inventors: Hwi-Chan Jun, Yongin-si (KR); Dae-Hee Weon, Seongnam-si (KR); Heon-Jong Shin, Yongin-si (KR); Yu-Sun Lee, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/801,937

(22) Filed: Jul. 17, 2015

(65) Prior Publication Data
US 2016/0104678 A1    Apr. 14, 2016

(30) Foreign Application Priority Data
Oct. 10, 2014    (KR) ........................ 10-2014-0136531

(51) Int. Cl.
*H01L 23/535* (2006.01)
*H01L 27/02* (2006.01)
(Continued)

(52) U.S. Cl.
CPC ........ *H01L 23/535* (2013.01); *H01L 27/0207* (2013.01); *H01L 27/088* (2013.01);
(Continued)

(58) Field of Classification Search
None
See application file for complete search history.

(56) References Cited

U.S. PATENT DOCUMENTS 7,884,396 B2    2/2011    Costrini et al.
7,960,759 B2    6/2011    Frederick et al.
(Continued)

OTHER PUBLICATIONS

ITRS—International Technology Roadmap for Semiconductors, Process Integration, Devices, and Structures, 2013 edition.*

*Primary Examiner* — Marc Armand
*Assistant Examiner* — Younes Boulghassoul
(74) *Attorney, Agent, or Firm* — Harness, Dickey & Pierce, P.L.C.

(57) ABSTRACT

In a semiconductor device, a first gate structure having a first end portion is formed on a substrate. A second gate structure is formed on the substrate, and has a second end portion opposite to the first end portion of the first gate structure in a diagonal direction. A cross-coupling pattern is formed between the first and second gate structure, and electrically connects the first and second gate structures to each other. A first contact plug directly contacts an upper portion of the first end portion of the first gate structure and a first upper sidewall of the cross-coupling pattern. A second contact plug directly contacts an upper portion of the second end portion of the second gate structure and a second upper sidewall of the cross-coupling pattern. In the semiconductor device, a parasitic capacitance due to the cross-coupling structure may decrease.

18 Claims, 17 Drawing Sheets

(51) Int. Cl.
*H01L 29/423* (2006.01)
*H01L 27/088* (2006.01)
*H01L 21/8234* (2006.01)

(52) U.S. Cl.
CPC *H01L 29/42364* (2013.01); *H01L 21/823437* (2013.01); *H01L 21/823475* (2013.01); *H01L 27/0886* (2013.01); *H01L 2924/0002* (2013.01)

(56) References Cited

U.S. PATENT DOCUMENTS

| | | |
|---|---|---|
| 8,258,578 B2 | 9/2012 | Carlson |
| 8,421,180 B2 | 4/2013 | Liu |
| 8,569,841 B2 | 10/2013 | Becker et al. |
| 8,642,471 B2 | 2/2014 | Yin et al. |
| 8,692,229 B2 | 4/2014 | Cohen et al. |
| 8,741,763 B2 | 6/2014 | Ma et al. |
| 8,969,199 B1 * | 3/2015 | Yuan .................. H01L 21/0334 438/666 |
| 9,324,715 B2 * | 4/2016 | Azmat .................. H01L 27/092 |
| 2013/0059434 A1 | 3/2013 | Yang et al. |
| 2014/0027918 A1 | 1/2014 | Rashed et al. |
| 2014/0131815 A1 | 5/2014 | Yu et al. |
| 2014/0131816 A1 | 5/2014 | Wang et al. |
| 2014/0141586 A1 | 5/2014 | Hu et al. |
| 2015/0097249 A1 * | 4/2015 | Kim .................. H01L 21/82347 257/401 |
| 2015/0287604 A1 * | 10/2015 | Stephens ........... H01L 21/76895 438/587 |
| 2016/0086947 A1 * | 3/2016 | Park ...................... H01L 27/092 257/369 |
| 2016/0099211 A1 * | 4/2016 | Baek ..................... H01L 27/088 257/774 |
| 2016/0111341 A1 * | 4/2016 | Kim .................. H01L 21/82387 257/369 |

\* cited by examiner

SEMICONDUCTOR DEVICE HAVING A GATE CUTTING REGION AND A CROSS-COUPLING PATTERN BETWEEN GATE STRUCTURES

CROSS-REFERENCE TO RELATED APPLICATION

This application claims priority under 35 USC §119 to Korean Patent Application No. 10-2014-0136531, filed on Oct. 10, 2014 in the Korean Intellectual Property Office (KIPO), the contents of which are herein incorporated by reference in their entirety.

BACKGROUND

1. Field

Example embodiments relate to semiconductor devices and/or methods of manufacturing the same. More particularly, example embodiments relate to semiconductor devices including a cross-coupling structure and/or methods of manufacturing the same.

2. Description of the Related Art

A semiconductor device may include a plurality of conductive patterns and a connection pattern for electrically connecting the conductive patterns in order to realize circuits. The conductive patterns and the connection pattern typically are formed in a small area and have a low parasitic capacitance and a low resistance.

SUMMARY

Some example embodiments provide a semiconductor device including a cross-coupling structure.

According to at least one example embodiment, a semiconductor device includes a first gate structure, a second gate structure, a cross-coupling pattern, a first contact plug, and a second contact plug. The first gate structure is formed on a substrate, extends in a first direction and has a first end portion. The second gate structure is formed on the substrate, extends in the first direction and is spaced apart from the first gate structure. The second gate structure has a second end portion opposite to the first end portion of the first gate structure in a diagonal direction with respect to the first direction. The cross-coupling pattern is formed between the first and second gate structure, contacts sidewalls of the first and second gate structures and electrically connects the first and second gate structures to each other. The first contact plug directly contacts an upper portion of the first end portion of the first gate structure and a first upper sidewall of the cross-coupling pattern. Also, the second contact plug directly contacts an upper portion of the second end portion of the second gate structure and a second upper sidewall of the cross-coupling pattern.

In some example embodiments, top surfaces of the first and second gate structures, the cross-coupling pattern and the first and second contact plugs may be substantially coplanar with one another.

In some example embodiments, a bottom surface of the cross-coupling pattern may contact the substrate.

In some example embodiments, the substrate may include active fins, and the first and second gate structures may cross the active fins.

In some example embodiments, each of the first and second gate structures may include a gate insulation layer, a gate electrode and a hard mask sequentially stacked, wherein the first contact plug may contact a sidewall of the hard mask and a top surface of the gate electrode of the first gate structure, and the second contact plug may contact a sidewall of the hard mask and a top surface of the gate electrode of the second gate.

In some example embodiments, the top surfaces of the first and second contact plugs may be substantially coplanar with top surfaces of the hard masks of the first and second gate structures.

In some example embodiments, the substrate may include a gate cutting region having a rectangular shape in plan view between the first and second gate electrodes, wherein edges of the gate cutting region may be adjacent to the first and second end portions of the first and second gate structures, and wherein the cross-coupling pattern may be disposed in the gate cutting region.

In some example embodiments, an insulation layer pattern may further be included in the gate cutting region surrounding sidewalls of the cross-coupling pattern.

In some example embodiments, the insulation layer pattern may include silicon oxide.

In some example embodiments, a third gate structure extending in the first direction and spaced apart from the first gate structure in the first direction and a fourth gate structure extending in the first direction and spaced apart from the second gate structure in the first direction may further be included. Each of the third and fourth gate structures may be disposed at an outside of the gate cutting region.

In some example embodiments, spacers may be further formed on sidewalls of the first and second gate electrodes, wherein each of the spacers may extend in the first direction.

In some example embodiments, the cross-coupling pattern may include a first portion contacting a sidewall of the first end portion of the first gate structure and extending in a third direction, a third portion contacting a sidewall of the second end portion of the second gate structure and extending in the third direction, and a second portion between the first and third portions.

In some example embodiments, the cross-coupling pattern and the first and second contact plugs may include substantially the same conductive material.

According to some example embodiments, a semiconductor includes a first gate structure, a second gate structure, a cross-coupling pattern, a first contact plug, and a second contact plug. The first gate structure includes a first gate electrode and a first hard mask sequentially stacked on a substrate, the first gate structure has a first end portion at which the first gate structure is exposed by the first hard mask. The second gate structure includes a second gate electrode and a second hard mask sequentially stacked on the substrate and is spaced apart from the first gate structure, the second gate structure has a second end portion at which the second gate structure is exposed by the second hard mask, the second end portion of the second gate structure is opposite to the first end portion of the first gate structure in a diagonal direction. The cross-coupling pattern is between the first and second gate structures, the cross-coupling pattern contacts sidewalls of the first and second gate electrodes and electrically connects the first and second gate structures to each other. The first contact plug directly contacts a sidewall of the first hard mask, a top surface of the first gate electrode, and a first upper sidewall of the cross-coupling pattern. Also, the second contact plug directly contacts a sidewall of the second hard mask, a top surface of the second gate electrode, and a second upper sidewall of the cross-coupling pattern.

In some example embodiments, top surfaces of the first and second gate structures, the cross-coupling pattern and the first and second contact plug may be substantially coplanar with one another.

In some example embodiments, the substrate may include a gate cutting region having a rectangular shape in plan view between the first and second gate electrode, wherein edges of the gate cutting region may be adjacent to the first and second end portions, and wherein the cross-coupling pattern may be disposed in the gate cutting region.

In some example embodiments, each of the first and second contact plugs may be at the edges of the gate cutting region, and may overlap both of an inside and an outside of the gate cutting region.

In some example embodiments, an insulation layer pattern may be further formed on the gate cutting region surrounding sidewalls of the gate cutting region.

In some example embodiments, a fifth gate structure and a sixth gate structure may be further formed on a portion of the substrate spaced apart from the gate cutting region, wherein the fifth and sixth gate structures may have stacked structures substantially the same as the structures of the first and second gate structures.

In some example embodiments, a third contact plug may contact an impurity region at an upper portion of the substrate adjacent to the fifth and sixth gate structures, and a fourth contact plug may contact a gate electrode of each of the fifth and sixth gate structures.

According to some example embodiments, a semiconductor device includes a substrate, a first gate structure, a second gate structure, a cross-coupling pattern, a first contact plug, and a second contact plug. The substrate includes a gate cutting region having a rectangular shape in plan view. The first gate structure has a first end portion on a substrate, and the first end portion contacts a first side of the gate cutting region. The second gate structure has a second end portion and is spaced apart from the first gate structure on the substrate, the second end portion is opposite to the first end portion of the first gate structure in a diagonal direction, and the second end portion contacts a second side of the gate cutting region. The cross-coupling pattern is between the first and second gate structures in the gate cutting region, the cross-coupling pattern electrically connects the first and second gate structures to each other. The first contact plug is formed at an edge of the gate cutting region, and the first contact plug directly contacts the first gate structure and a first upper sidewall of the cross-coupling pattern. Also, the second contact plug is formed at an edge of the gate cutting region, and the second contact plug directly contacts the second gate structure and a second upper sidewall of the cross-coupling pattern.

In some example embodiments, top surfaces of the first and second gate structures, the cross-coupling pattern and the first and second contact plug are substantially coplanar with one another.

In some example embodiments, an insulation layer pattern further formed on the gate cutting region surrounding sidewalls of the cross-coupling pattern.

Some example embodiments also relate to a semiconductor device that includes a first gate on a substrate, the first gate having a first end portion, a second gate on the substrate and separate from the first gate, the second gate having a second end portion opposite to the first end portion of the first gate in a diagonal direction with respect to the substrate, a cross-coupling pattern between the first and second gates, the cross-coupling pattern being in contact with sidewalls of the first and second gates and electrically connecting the first and second gates to each other, a first contact plug directly in contact with a first portion of the first gate and a first sidewall of the cross-coupling pattern, and a second contact plug directly in contact with a second portion of the second gate and a second sidewall of the cross-coupling pattern, upper surfaces of the first and second gates of the cross-coupling pattern and of the first and second contact plugs being substantially coplanar.

According to some example embodiments, a top surface of the cross-coupling structure may be substantially coplanar with or lower than the top surface of the gate structure. The top surface of the cross-coupling structure may be relatively high, so that a parasitic capacitance due to the cross-coupling structure may decrease. Thus, the semiconductor device may be operated at high speed.

BRIEF DESCRIPTION OF THE DRAWINGS

Some example embodiments will be more clearly understood from the following detailed description taken in conjunction with the accompanying drawings. FIGS. 1 to 18 represent non-limiting, some example embodiments as described herein.

FIG. 1 is a plan view illustrating a semiconductor device in accordance with some example embodiments, FIG. 2 is a cross-sectional view illustrating the semiconductor device of FIG. 1;

FIG. 11 is a plan view illustrating a semiconductor device in accordance with some example embodiments;

FIG. 12 is a plan view illustrating a semiconductor device in accordance with some example embodiments;

FIG. 13 is a plan view illustrating a semiconductor device in accordance with some example embodiments;

FIGS. 14 to 18 are plan views illustrating a method of manufacturing a semiconductor device in accordance with some example embodiments.

DESCRIPTION OF EMBODIMENTS

Figure 1:
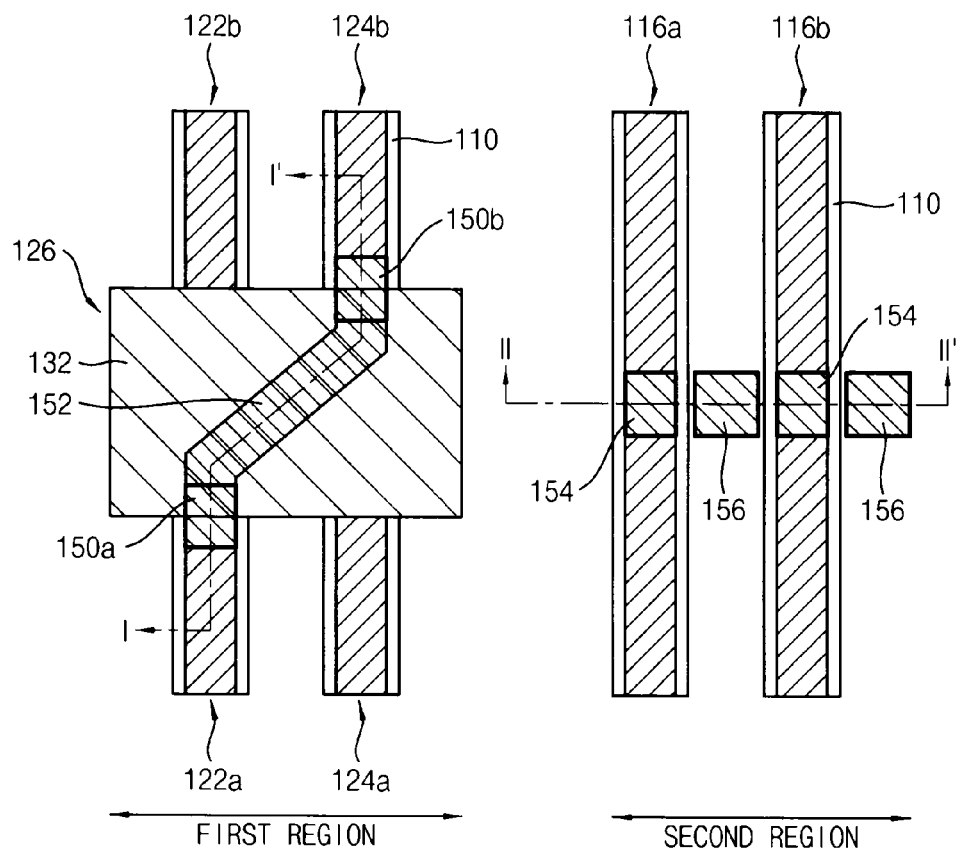

Various example embodiments will be described more fully hereinafter with reference to the accompanying drawings, in which some example embodiments are shown. The example embodiments may, however, be embodied in many different forms and should not be construed as limited to the example embodiments set forth herein. Rather, these example embodiments are provided so that this description will be thorough and complete, and will fully convey the scope of the example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Some example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
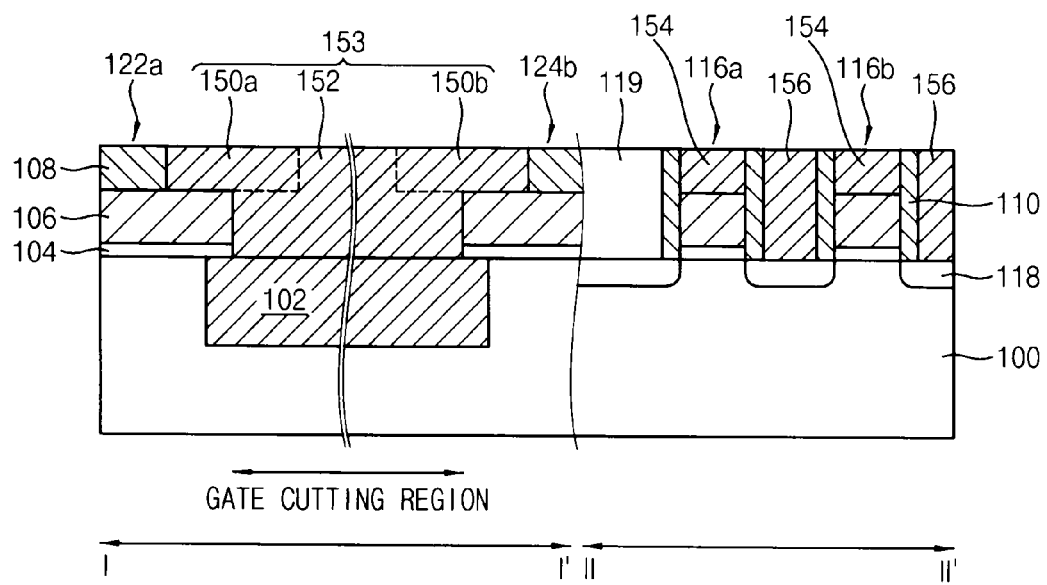

FIG. 1 is a plan view illustrating a semiconductor device in accordance with some example embodiments, and FIG. 2 is a cross-sectional view illustrating the semiconductor device of FIG. 1. FIG. 2 shows cross-sections taken along lines I-I' and II-II', respectively, of FIG. 1.

Referring to FIGS. 1 and 2, a substrate 100 may include a first region including a gate cutting region 126 and a second region that does not include a gate cutting region therein. The substrate 100 may be divided into a field region on which an isolation pattern 102 is formed and an active region on which no isolation pattern is formed. The isolation pattern 102 may be formed in a portion of the gate cutting region 126.

A plurality of gate structures may be formed on the first and second regions of the substrate 100, and each of the gate structures may extend in a first direction. Each of the gate structures may be cut in the gate cutting region 126. The gate cutting region 126 may have a rectangular shape in plan view. A cross-coupling structure 153 may be formed in the gate cutting region 126, and may electrically connect the gate structures to each other in a diagonal direction with respect to the first direction.

Hereinafter, a first device on the first region of the substrate 100 will be illustrated.

In the first region of the substrate 100, an end portion of each of the gate structures may be disposed adjacent to an edge of the gate cutting region 126, and the gate structures may be disposed at an outside of the gate cutting region 126. In some example embodiments, at least four gate structures may be formed in the first region, which may be referred to as first, second, third and fourth gate structures 122a, 124b, 122b and 124a, respectively.

A first preliminary gate structure extending in the first direction may be sectioned into two pieces, which may form the first gate structure 122a and the third gate structure 122b, respectively. A second preliminary gate structure extending in the first direction may be sectioned into two pieces, which may form the second gate structure 124b and the fourth gate structure 124a, respectively. The first and second gate structure 122a and 124b may be spaced apart from each other in the diagonal direction, and may be electrically connected to each other via the cross-coupling structure 153.

That is, the first gate structure 122*a* may extend in the first direction, and a first end portion of the first gate structure 122*a* may be adjacent to the edge of the gate cutting region 126. The second gate structure 124*b* may extend in the first direction, and may be spaced apart from the first gate structure 122*a*. A second end portion of the second gate structure 124*b* may be adjacent to the edge of the gate cutting region 126, and may be opposite to the first end portion of the first gate structure 122*a* in the diagonal direction.

The third gate structure 122*b* may extend in the first direction, and may be opposite to the first gate structure 122*a* in the first direction. A third end portion of the third gate structure 122*b* may be adjacent to the edge of the gate cutting region 126. The fourth gate structure 124*a* may extend in the first direction, and may be opposite to the second gate structure 124*b* in the first direction. A fourth end portion of the fourth gate structure 124*a* may be adjacent to the edge of the gate cutting region 126.

Each of the first to fourth gate structures 122*a*, 124*b*, 122*b* and 124*a* may include a gate insulation layer pattern 104, a gate electrode 106 and a hard mask 108 sequentially stacked or in a sequentially stacked configuration. Spacers 110 may be formed on sidewalls of the first to fourth gate structures 122*a*, 124*b*, 122*b* and 124*a*. The spacers 110 may include, e.g., silicon nitride. In some example embodiments, the spacers 110 may not be formed on sidewalls of the first to fourth end portions of the first to fourth gate structures 122*a*, 124*b*, 122*b* and 124*a*, respectively.

The hard mask 108 of each of the first and second gate structures 122*a* and 124*b* may have a length in the first direction that is less than the length of the gate electrode 106 of each of the first and second gate structures 122*a* and 124*b*. An upper surface of the gate electrode 106 adjacent to the gate cutting region 126 may not be covered by the hard mask 108.

The gate electrodes 106 of the first and second gate structures 122*a* and 124*b* may be electrically connected to each other via the cross-coupling structure 153. The cross-coupling structure 153 may include a cross-coupling pattern 152, a first contact plug 150*a* and a second contact plug 150*b*.

The cross-coupling pattern 152 may contact sidewalls of the first and second end portions of the first and second gate structures 122*a* and 124*b*, respectively, and may be disposed between the first and second gate structures 122*a* and 124*b*. Thus, the cross-coupling pattern 152 may be electrically connected to the first and second gate structures 122*a* and 124*b*. The cross-coupling pattern 152 may be at an inside of the gate cutting region 126.

A top surface of the cross-coupling pattern 152 may be substantially coplanar with the top surfaces of the first to fourth gate structures 122*a*, 124*b*, 122*b* and 124*a*, and thus, the total top surface including or consisting of the top surfaces of the cross-coupling pattern 152 and the first to fourth gate structures 122*a*, 124*b*, 122*b* and 124*a* may be substantially flat. A bottom surface of the cross-coupling pattern 152 may be on the isolation pattern 102.

The cross-coupling pattern 152 may include first, second and third portions. The first portion of the cross-coupling pattern 152 may contact a sidewall of the first end portion of the first gate structure 122*a* and may extend in the first direction, the second portion of the cross-coupling pattern 152 may be bent to extend in a direction forming an acute angle with the first direction, and the third portion of the cross-coupling pattern 152 may contact a sidewall of the second end portion of the second gate structure 124*b*, and may extend in the first direction. The first to third portions of the cross-coupling pattern 152 may be connected with one another.

In some example embodiments, the first portion of the cross-coupling pattern 152 may contact a sidewall of the gate electrode 106 of the first gate structure 122*a*. The second portion of the cross-coupling pattern 152 may extend in a direction forming an angle of about 20° to about 70° with the first direction. In at least one example embodiment, the second portion of the cross-coupling pattern 152 may extend in a direction forming an angle of about 45° with the first direction. The third portion of the cross-coupling pattern 152 may contact a sidewall of the gate electrode 106 of the second gate structure 124*b*.

The first contact plug 150*a* may directly contact a top surface of the gate electrode 106 of the first gate structure 122*a* and a first upper sidewall or upper boundary, designated in hashed lines, of the cross-coupling pattern 152. The first contact plug 150*a* may be disposed between the first gate structure 122*a* and the cross-coupling pattern 152. That is, the first contact plug 150*a* may be disposed at the edge of the gate cutting region 126 to overlap both of the inside and the outside of the gate cutting region 126.

A top surface of the first contact plug 150*a* may be substantially coplanar with the top surfaces of the first gate structure 122*a* and the cross-coupling pattern 152, and may be substantially flat. In fact, the first contact plug 150*a* may be formed in a first hole (not shown) that may be formed by removing a portion of the hard mask 108 and an upper portion of the cross-coupling pattern 152. A top surface of the gate electrode 106 of the first gate structure 122*a* may be exposed by the first hole, and the first contact plug 150*a* may be formed to fill the first hole.

A top surface of the second contact plug 150*b* may be substantially coplanar with a top of the second gate structure 124*b* and the cross-coupling pattern 152, and may be flat. In fact, the second contact plug 150*b* may be formed in a second hole (not shown) that may be formed by removing a portion of the hard mask 108 and an upper portion of the cross-coupling pattern 152. A top surface of the gate electrode 106 of the second gate structure 124*b* may be exposed by the second hole, and the second contact plug 150*b* may be formed to fill the second hole.

The first and second contact plugs 150*a* and 150*b* may include a conductive material substantially the same as the material of the cross-coupling pattern 152. The conductive material may include a metal, e.g., tungsten. The first and second contact plugs 150*a* and 150*b* and the cross-coupling pattern 152 may be integrally formed to define one structure. Thus, the first contact plug 150*a* may directly contact the first upper sidewall of the cross-coupling pattern 152, and the second contact plug 150*b* may directly contact the second upper sidewall of the cross-coupling pattern 152.

Bottom surfaces of the first and second contact plugs 150*a* and 150*b* may be higher than the bottom surfaces of the cross-coupling pattern 152 and the first and second gate structures 122*a* and 124*b*.

An insulation layer pattern 132 may be formed on the substrate 100 in the gate cutting region 126 surrounding the sidewall of the cross-coupling pattern 152. The insulation layer pattern 132 may include a material having a high etching selectivity with respect to the spacers 110. The insulation layer pattern 132 may include, e.g., silicon oxide.

An insulating interlayer 119 may be formed on the substrate 100 between the first to fourth gate structures 122*a*, 124*b*, 122*b* and 124*a*. A top surface of the insulating interlayer 119 may be substantially coplanar with the top surfaces of the first to fourth gate structures 122a, 124b, 122b and 124a, and may be flat.

The cross-coupling structure 153 may not be formed over the top surfaces of the insulation layer pattern 132 and the insulating interlayer 119. Also, the top surface of the cross-coupling structure 153 may not be higher than the top surfaces of the first to fourth gate structures 122a, 124b, 122b and 124a. Thus, a height of the cross-coupling structure 153 may decrease, and thus a parasitic capacitance due to the cross-coupling structure 153 may decrease so that the first device may have a high speed.

In some example embodiments, impurity regions (not shown) serving as source/drain regions may be formed at upper portions of the substrate 100 adjacent to the first to fourth gate structure 122a, 124b, 122b and 124a, which may not be formed in the gate cutting region 126.

Hereinafter, a second device on the second region of the substrate 100 may be illustrated.

Gate structures may be formed on the second region of the substrate 100. The gate structures may not be electrically connected to any cross-coupling pattern 152. The gate structures in the second region may be referred to as fifth and sixth gate structures 116a and 116b. Alternatively, no gate structure may be formed in the second region of the substrate 100.

Each of the fifth and sixth gate structures 116a and 116b may extend in the first direction. Each of the fifth and sixth gate structures 116a and 116b may include a gate insulation pattern 104, a gate electrode 106 and a hard mask 108 sequentially stacked. The fifth and sixth gate structures 116a and 116b may have stacked structures that are substantially the same as the structures of the first to fourth gate structures 122a, 124b, 122b and 124a. Spacers 110 may be formed on sidewalls of the fifth and sixth gate structures 116a and 116b. The spacers 110 may include a material that is substantially the same as the material of the spacers 110 on the sidewalls of the first to fourth gate structures 122a, 124b, 122b and 124a. No gate cutting region may be formed in the second region of the substrate 100, and thus the fifth and sixth gate structures 116a and 116b may have no cutting portion.

Impurity regions 118 serving as source/drain regions may be formed at upper portions of the substrate 100 adjacent to the fifth and sixth gate structures 116a and 116b. The insulating interlayer 119 may be formed between the fifth and sixth gate structures 116a and 116b. A top surface of the insulating interlayer 119 may be substantially coplanar with top surfaces of the fifth and sixth gate structures 116a and 116b, and may be substantially flat.

A third contact plug 156 may be formed through the insulating interlayer 119 and contact a portion of the impurity regions 118. The third contact plug 156 may be formed when processes for forming the cross-coupling pattern 152 are performed, e.g., by performing an etching process, a deposition process and a planarization process, etc., for forming the cross-coupling pattern 152. Thus, the third contact plug 156 may include a conductive material substantially the same as the material of the cross-coupling pattern 152. A top surface of the third contact plug 156 may be substantially coplanar with top surfaces of the fifth and sixth gate structures 116a and 116b, and may be substantially flat.

A fourth contact plug 154 may be formed through the hard masks 108 of the fifth and sixth gate structures 116a and 116b, and contact the gate electrodes 106 of the fifth and sixth gate structures 116a and 116b. The fourth contact plug 154 may be formed when processes for forming the first and second contact plugs 150a and 150b are performed, e.g., an etching process, a deposition process and a planarization process, etc., for forming the first and second contact plugs 150a and 150b. Thus, the fourth contact plug 154 may include a conductive material substantially the same as the material of the first and second contact plugs 150a and 150b.

The fourth contact plug 154 may be formed to fill a fourth contact hole (not shown) that may be formed by removing portions of the hard masks 108 of the fifth and sixth gate structures 116a and 116b. A top surface of the fourth contact plug 154 may be substantially coplanar with the top surfaces of the fifth and sixth gate structures 116a and 116b, and may be substantially flat.

That is, the top surfaces of the cross-coupling structure 153, the third and fourth contact plugs 156 and 154, the first to sixth gate structure 122a, 124b, 122b, 124a, 116a and 116b, the insulation layer pattern 132 and the insulating interlayer 119 may be substantially coplanar with one another.

As illustrated above, the cross-coupling structure 153 may include the first contact plug 150a extending from the hard mask 108 of the first gate structure 122a to the cross-coupling pattern 152 and contacting the gate electrode 106 of the first gate structure 122a, and the second contact plug 150b extending from the hard mask 108 of the second gate structure 124b to the cross-coupling pattern 152 and contacting the gate electrode 106 of the second gate structure 124b. Thus, the first and second gate structures 122a and 124b disposed in the diagonal direction may be electrically connected to each other via the first and second contact plugs 150a and 150b and the cross-coupling pattern 152. The top surfaces of the first and second contact plugs 150a and 150b, the first and second gate structures 122a and 124b and the cross-coupling pattern 152 may be substantially coplanar with one another and may be substantially flat.

The cross-coupling structure 153 may not be formed on the insulation layer pattern 132 and the insulating interlayer 119, and the top surface of the cross-coupling structure 153 may not be higher than the top surfaces of the first to fourth gate structures 122a, 124b, 122b and 124a. Thus, heights of the cross-coupling structure 153 and the third and fourth contact plugs 156 and 154 may decrease, and a parasitic capacitance due to the cross-coupling structure 153 and the third and fourth contact plugs 156 and 154 may decrease so that the semiconductor device may have a high speed.

FIGS. 3A, 4A, 5A, 6A, 7A, 8A, 9A and 10A are plan views illustrating stages of a method of manufacturing a semiconductor device in accordance with some example embodiments. FIGS. 3B, 4B, 5B, 6B, 7B, 8B, 9B and 10B are cross-sectional views illustrating the stages of the method of manufacturing the semiconductor device.

FIGS. 3B, 4B, 5B, 6B, 7B, 8B, 9B and 10B show cross-sections taken along lines I-I' and II-II' of FIGS. 3A, 4A, 5A, 6A, 7A, 8A, 9A and 10A, respectively.

Figure 3A:
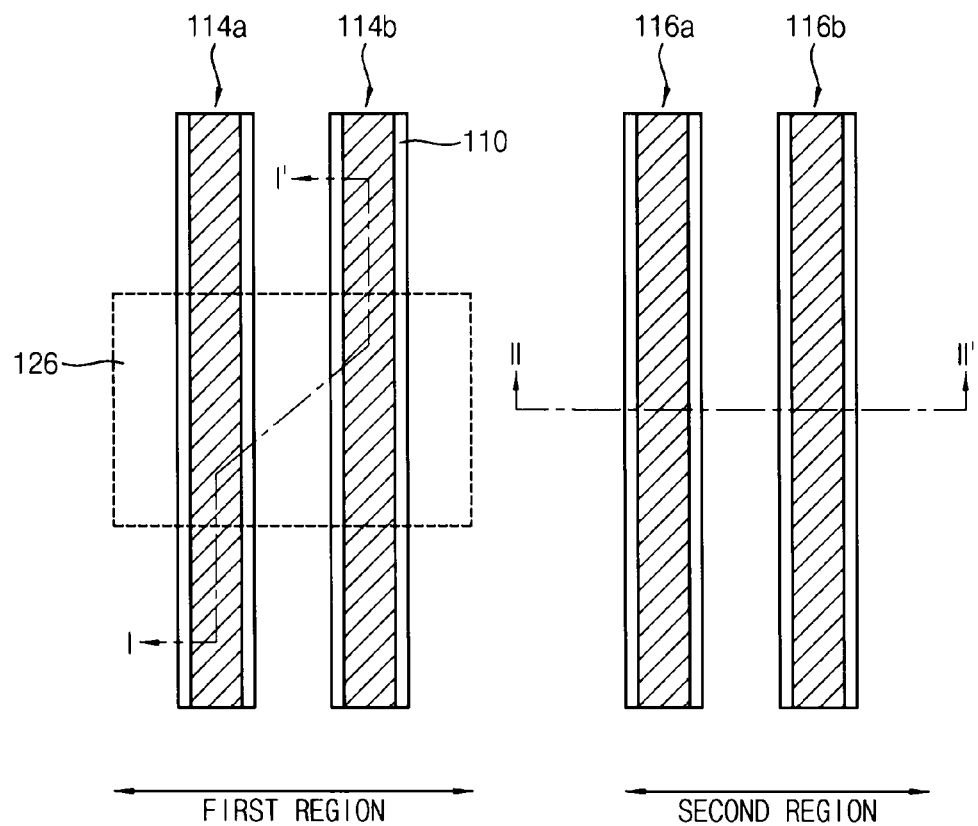
FIGS. 3A, 4A, 5A, 6A, 7A, 8A, 9A and 10A are plan views illustrating a method of manufacturing a semiconductor device in accordance with some example embodiments.
Figure 3B:
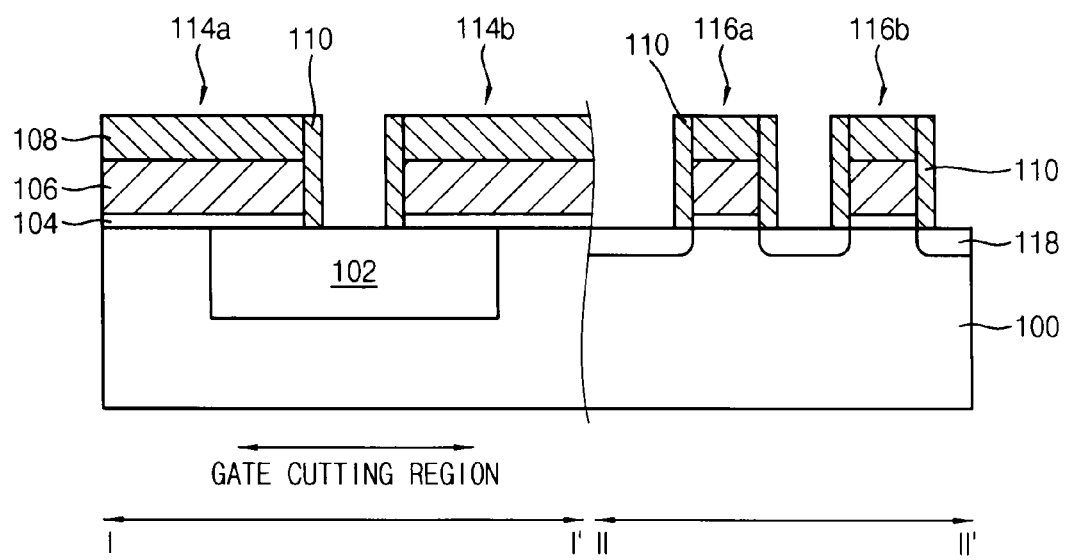
FIGS. 3B, 4B, 5B, 6B, 7B, 8B, 9B and 10B are cross-sectional views illustrating a method of manufacturing the semiconductor device.

Referring to FIGS. 3A and 3B, an isolation pattern 102 may be formed on a substrate 100 including a first region and a second region. A first preliminary gate structure 114a, a second preliminary gate structure 114b, a fifth gate structure 115a and a sixth gate structure 116b may be formed on the substrate 100.

The substrate 100 may be a silicon substrate, a germanium substrate, or a silicon-germanium substrate. In some embodiments, the substrate 100 may be a silicon-on-insulator (SOI) substrate or a germanium-on-insulator (GOI) substrate. The substrate 100 may be divided into a field region on which the isolation pattern 102 may be formed and an active region on which no isolation pattern may be formed. In some example embodiments, the isolation pattern 102 may be formed by a shallow trench isolation (STI) process, and may be formed to include an oxide, e.g., silicon oxide. The first region of the substrate 100 may include a gate cutting region 126 in which the first and second preliminary gate structures 114a and 114b may be subsequently cut. The gate cutting region 126 may be formed within the field region on which the isolation pattern 102 is formed.

The first and second preliminary gate structures 114a and 114b may be formed on the first region of the substrate 100, and the fifth and sixth gate structures 116a and 116b may be formed on the second region of the substrate 100. Particularly, a gate insulation layer, a gate electrode layer and a hard mask layer may sequentially formed on the substrate 100, and the hard mask layer may be patterned by a photolithography process using a photoresist pattern (not shown) to form a hard mask 108. The gate electrode layer and the gate insulation layer may be patterned using the hard mask 108 as an etching mask to form the first and second preliminary gate structures 114a and 114b in the first region and the fifth and sixth gate structures 116a and 116b in the second region. Each of the first and second preliminary gate structures 114a and 114b and the fifth and sixth gate structures 116a and 116b may include a gate insulation pattern 104, a gate electrode 106 and the hard mask 108 substantially stacked.

The gate insulation layer may be formed to include an oxide, e.g., silicon oxide, the gate electrode layer may be formed to include, e.g., polysilicon or a metal, and the hard mask layer may be formed to include a nitride, e.g., silicon nitride. The gate insulation layer may be formed by a chemical vapor deposition (CVD) process, an atomic layer deposition (ALD) process, etc. The gate electrode layer and the hard mask layer may be also formed by a CVD process, an ALD process, etc.

Each of the first and second preliminary gate structures 114a and 114b and the fifth and sixth gate structures 116a and 116b may be formed to extend in a first direction, and may be disposed in a second direction substantially perpendicular to the first direction.

A spacer layer may be conformally formed on the first and second preliminary gate structures 114a and 114b, the fifth and sixth gate structures 116a and 116b and the substrate 100, and etched by an anisotropic etching process to form spacers 110 on sidewalls of the first and second preliminary gate structures 114a and 114b and the fifth and sixth gate structures 116a and 116b, respectively. For example, the spacer layer may be formed to include a nitride, e.g., silicon nitride. The spacer layer may be formed by an ALD process, a CVD process, etc.

Impurities may be doped onto the substrate 100 to form impurity regions 118 serving as source/drain regions.

Figure 4A:
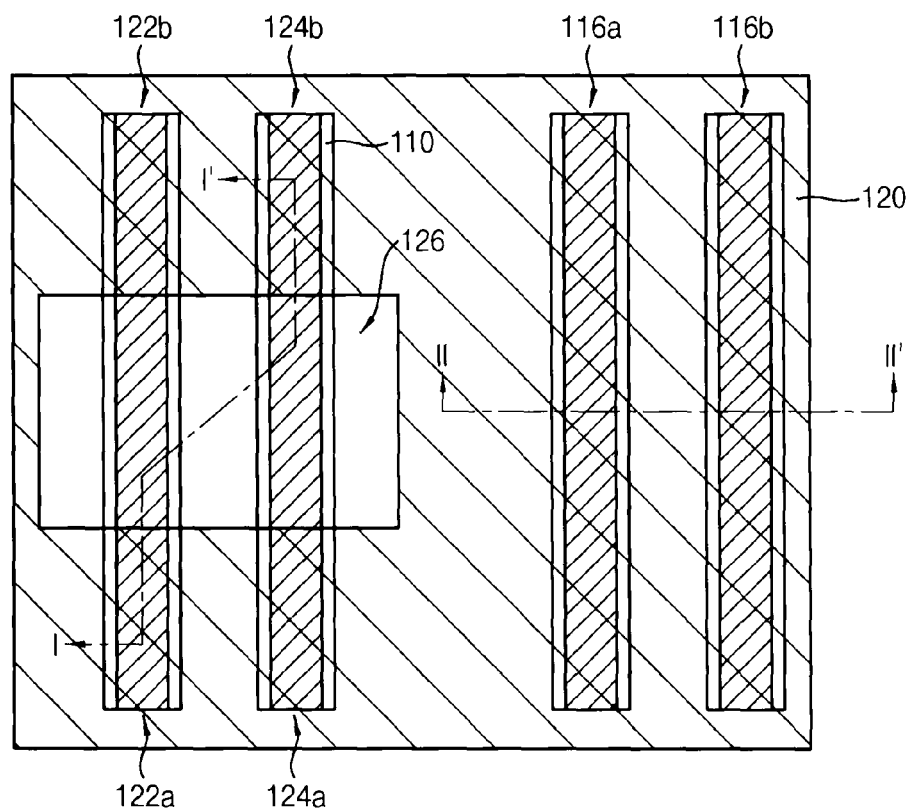
Figure 4B:
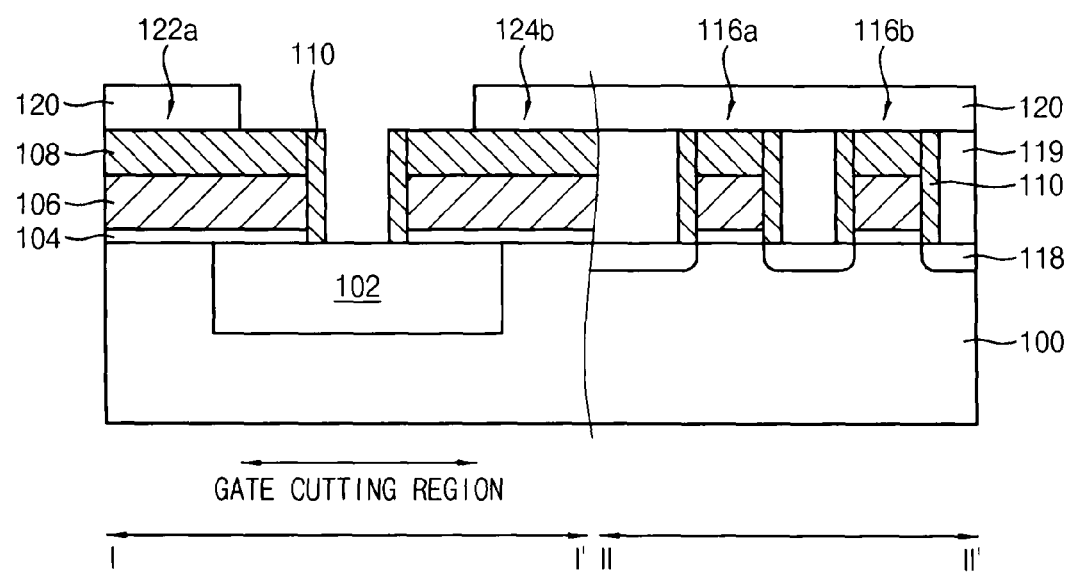

Referring to FIGS. 4A and 4B, an insulating interlayer 119 covering the first and second preliminary gate structures 114a and 114b and the fifth and sixth gate structures 116a and 116b may be formed on the substrate 100 and the isolation pattern 102, and the insulating interlayer 119 may be planarized until top surfaces of the first and second preliminary gate structures 114a and 114b and the fifth and sixth gate structures 116a and 116b may be exposed. For example, the insulating interlayer 119 may be formed to include silicon oxide. In some example embodiments, the planarization process may be performed by a chemical mechanical polishing (CMP) process and/or an etch back process. Alternatively, the deposition and planarization processes for the insulating interlayer 119 may be skipped to simplify the process, and subsequent processes may be performed.

A first etching mask 120 exposing the gate cutting region 126 may be formed on the first and second preliminary gate structures 114a and 114b, the fifth and sixth gate structures 114a and 114b and the insulating interlayer 119. The gate cutting region 126 may have a rectangular shape in plan view, which may include portions of the first and second preliminary gate structures 114a and 114b.

Figure 5A:
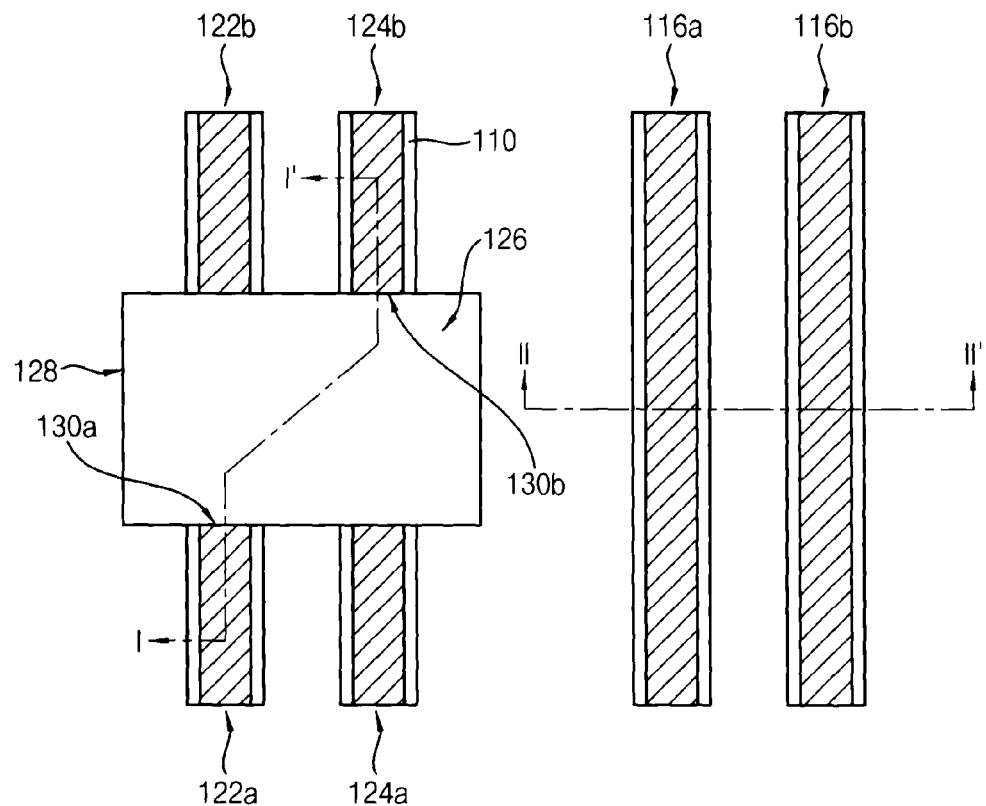
Figure 5B:
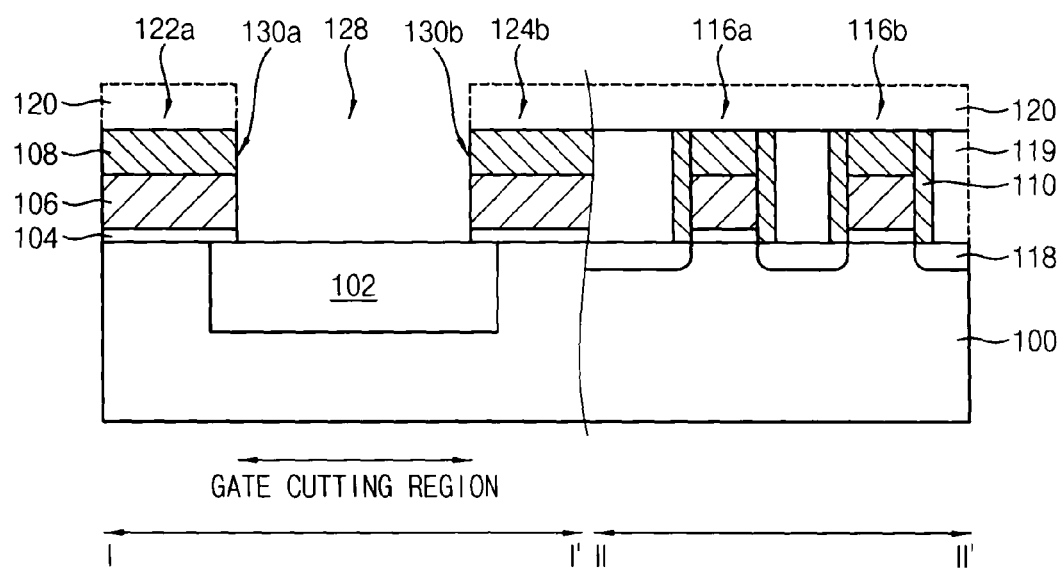

Referring to FIGS. 5A and 5B, the first and second preliminary gate structures 114a and 114b and the insulating interlayer 119 may be etched using the first etching mask 120 to form a first opening 128 exposing the gate cutting region 126 of the substrate 100.

By the process, the first preliminary gate structure 114a may be etched to form a first gate structure 122a and a third gate structure 122b, and the second preliminary gate structure 114b may be etched to form a second gate structure 124b and a fourth gate structure 124a. The first and second gate structures 122a and 124b may be spaced apart from each other in the diagonal direction, and the gate cutting region 126 may be disposed therebetween.

The first to fourth gate structures 122a, 124b, 122b and 124a may be formed by cutting the first and second preliminary gate structure 114a and 114b in the gate cutting region 126. Thus, end portions of the first to fourth gate structures 122a, 124b, 122b and 124a may be adjacent to edges of the gate cutting region 126. That is, the first to fourth gate structures 122a, 124b, 122b and 124a may include first to fourth end portions, respectively, and the first to fourth end portions 122a, 124b, 122b and 124a may be adjacent to edges of the gate cutting region 126. The spacers 110 may not be formed on sidewalls of the first to fourth end portions of the first to fourth gate structure 122a, 124b, 122b and 124a, so that the sidewalls of the first to fourth end portions may be exposed.

The first etching mask 120 may be removed.

Figure 6A:
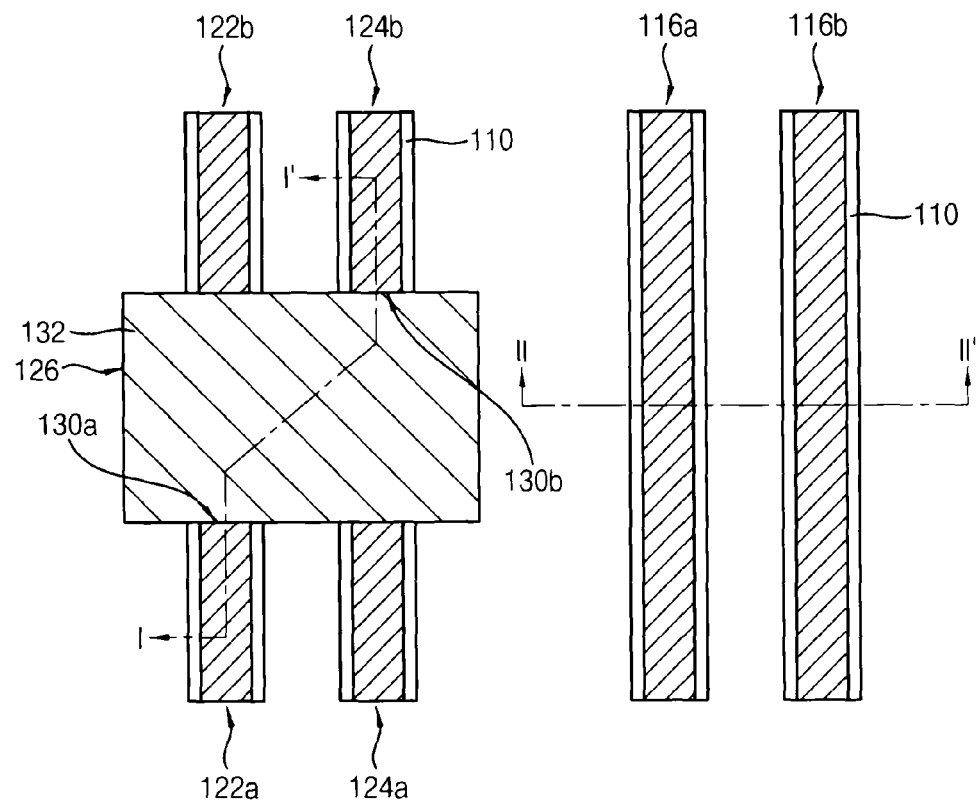
Figure 6B:
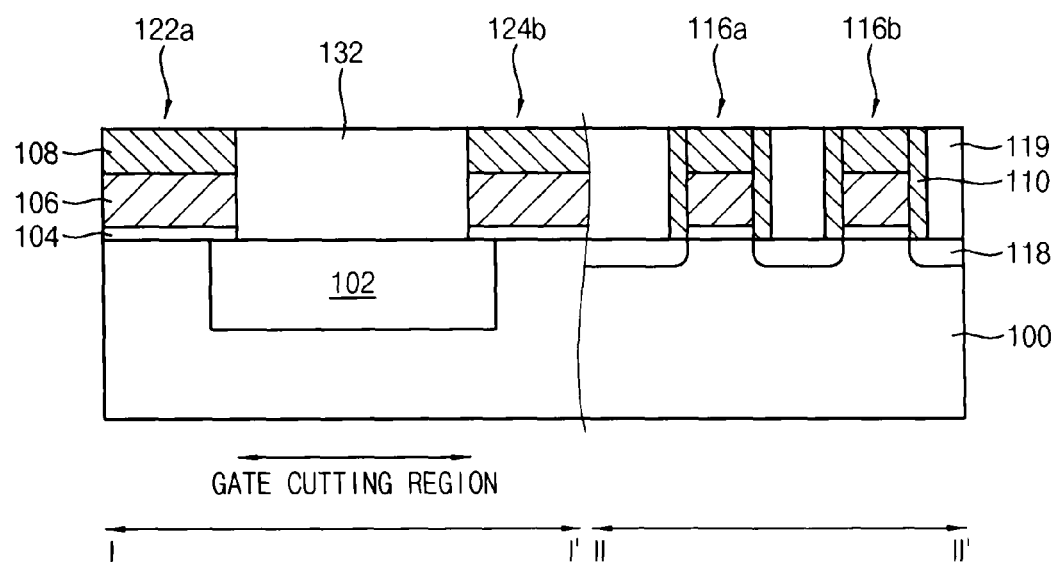

Referring to FIGS. 6A and 6B, an insulation layer may be formed on the substrate 100 and the insulating interlayer 119 to fill the first opening 128. The insulation layer may be planarized until top surfaces of the first to fourth gate structures 122a, 124b, 122b and 124a may be exposed to form an insulation layer pattern 132 filling the first opening 128. The insulation layer may be formed to include a material having a high etching selectivity with respect to the spacer 110. The insulation layer may be formed to include, e.g., silicon oxide. In some example embodiments, the planarization process may be performed by a CMP process and/or an etch back process.

Top surfaces of the first to sixth gate structures 122a, 124b, 122b, 124a, 116a and 116b, the insulation layer pattern 132 and the insulating interlayer 119 may be substantially coplanar with one another, and may be substantially flat. A portion of the insulation layer pattern 132 including silicon oxide may be formed on the substrate 100 to cover the gate cutting region 126.

Alternatively, when the insulating interlayer 119 is not formed, the insulation layer may be formed to fill gaps between the first to sixth gate structures 122a, 124b, 122b, 124a, 116a and 116b, and the insulation layer may be planarized to form a structure illustrated in FIGS. 6A and 6B.

Figure 7A:
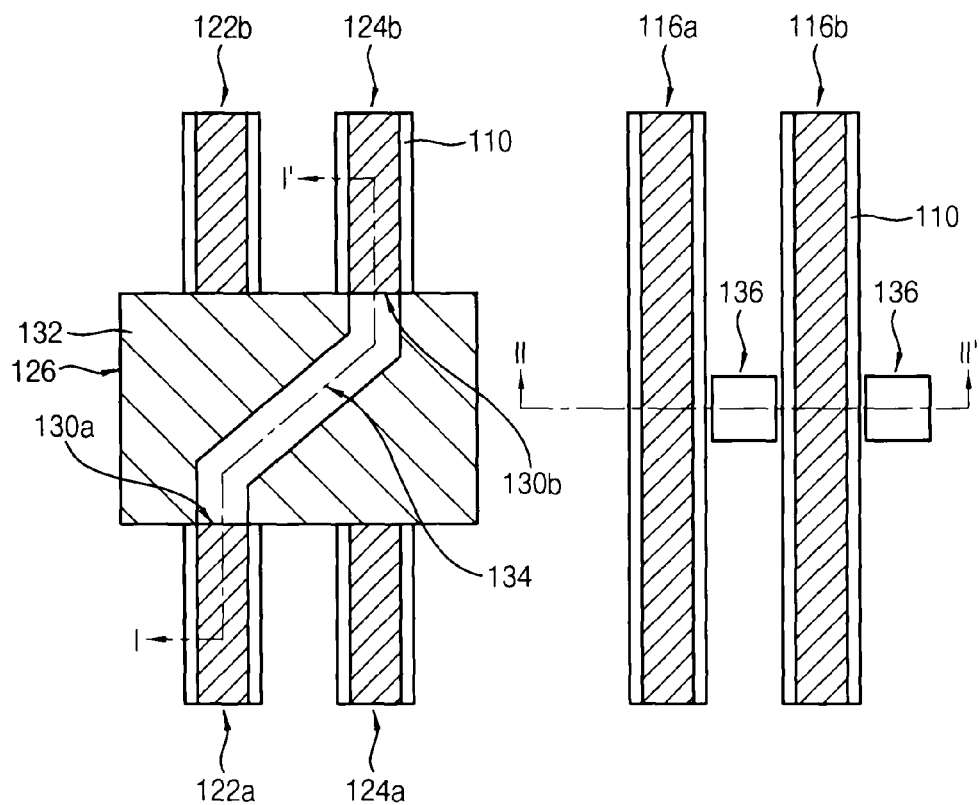
Figure 7B:
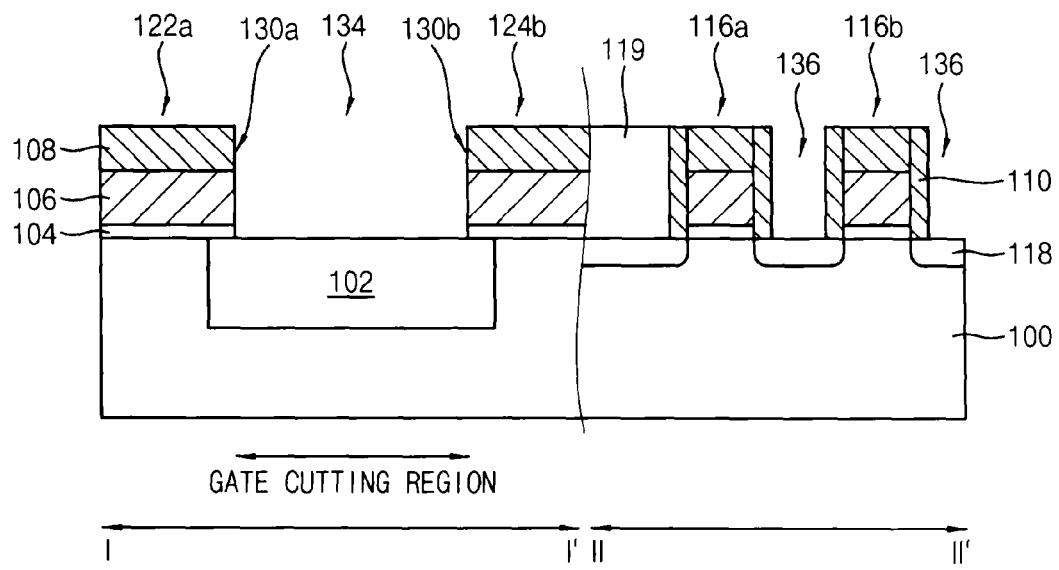

Referring to FIGS. 7A and 7B, a second etching mask (not shown) may be formed on the insulation layer pattern 132, the insulating interlayer 119 and the first to sixth gate structures 122a, 124b, 122b, 124a, 116a and 116b. The second etching mask may be formed to expose a portion for forming a cross-coupling pattern 152 (refer to FIGS. 10A and 10B) in the gate cutting region 126 and the impurity regions 118 between the fifth and sixth gate structures 116a and 116b in the second region. In some example embodiments, the insulation layer pattern 132 may include a material substantially the same as the material of the insulating interlayer 119, so that the insulation layer pattern 132 and the insulating interlayer 119 may not be differentiated from each other. Alternatively, the insulation layer pattern 132 and the insulating interlayer 119 may include different materials from each other.

The insulation layer pattern 132 and insulating interlayer 119 may be etched using the second etching mask to form a second opening 134 exposing the portion for forming the cross-coupling pattern 152 and a third contact hole 136 exposing the impurity regions 118.

The second opening 134 may expose sidewalls of the first end portion 130a of the first gate structure 122a and the second end portion 130b of the second gate structure 124b. A bottom of the second opening 134 may expose the isolation pattern 102 on the substrate 100. Particularly, the second opening 134 may include a first portion extending in the first direction from the sidewall of the first end portion 130a, a second portion bending from the first portion to extend in a diagonal direction, and a third portion extending in the first direction from the sidewall of the second end portion 130b. The first to third portions of the second opening 134 may be in communication with one another.

The second etching mask may be removed.

Figure 8A:
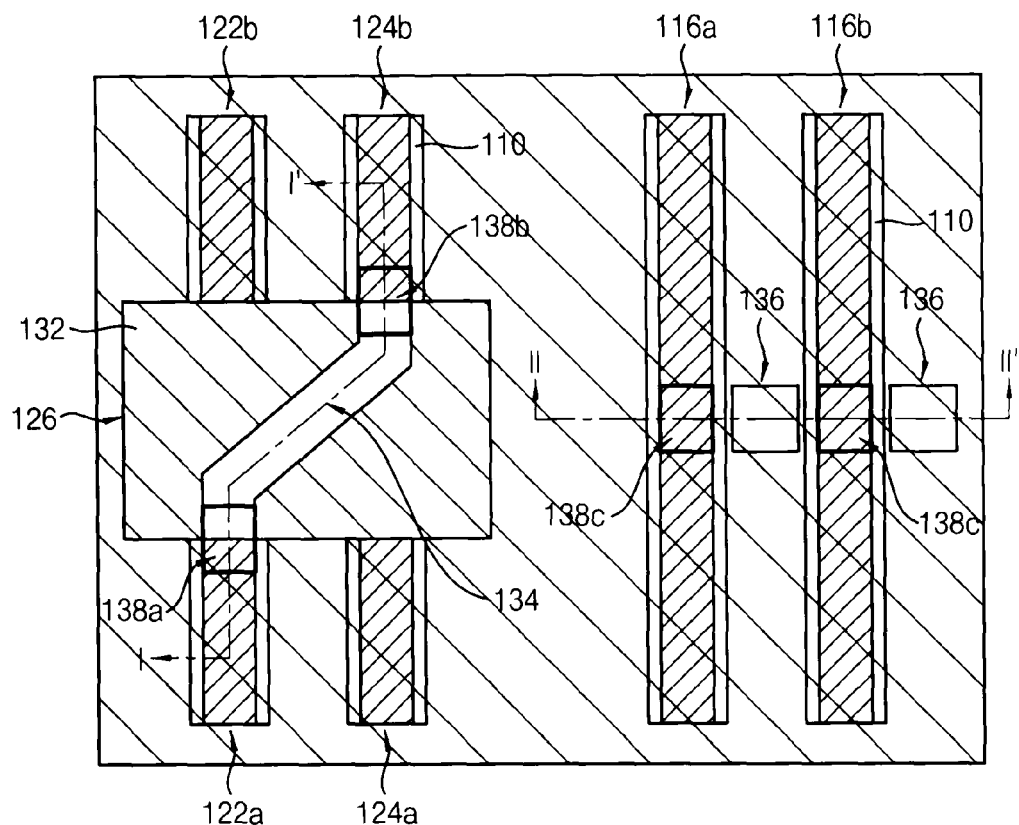
Figure 8B:
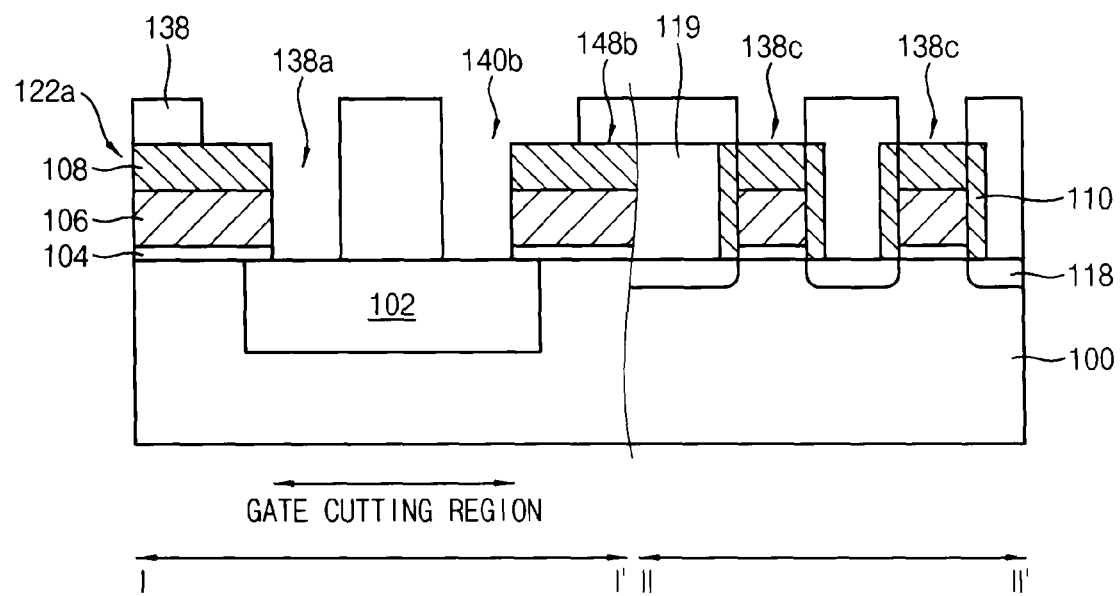

Referring to FIGS. 8A and 8B, a third etching mask 138 may be formed on the insulation layer pattern 132, the insulating interlayer 119 and the first to sixth gate structures 122a, 124b, 122b, 124a, 116a and 116b. The third etching mask 138 may be formed to expose portions for forming first and second contact holes 140a and 140b (refer to FIGS. 9A and 9B) and the fourth contact hole 142 (refer to FIGS. 9A and 9B). The first, second and fourth contact holes 140a, 140b and 142 may be filled with a conductive material to form contact plugs for electrically connecting gate electrodes 106 to each other by subsequent processes.

A first exposing portion 138a for forming the first opening 140a in the third etching mask 138 may overlap the first gate structure 122a and the cross-coupling pattern 152. A second exposing portion 138b for forming the second opening 140b in the third etching mask 138 may overlap the second gate structure 124b and the cross-coupling pattern 152. That is, each of the first and second exposing portions 138a and 138b may be disposed at each of the edges of the gate cutting region 126 to overlap both of the inside and the outside of the gate cutting region 126. A third exposing portion 138c for forming the fourth contact hole 142 in the third etching mask 138 may overlap the fifth and sixth first gate structures 116a and 116b.

Figure 9A:
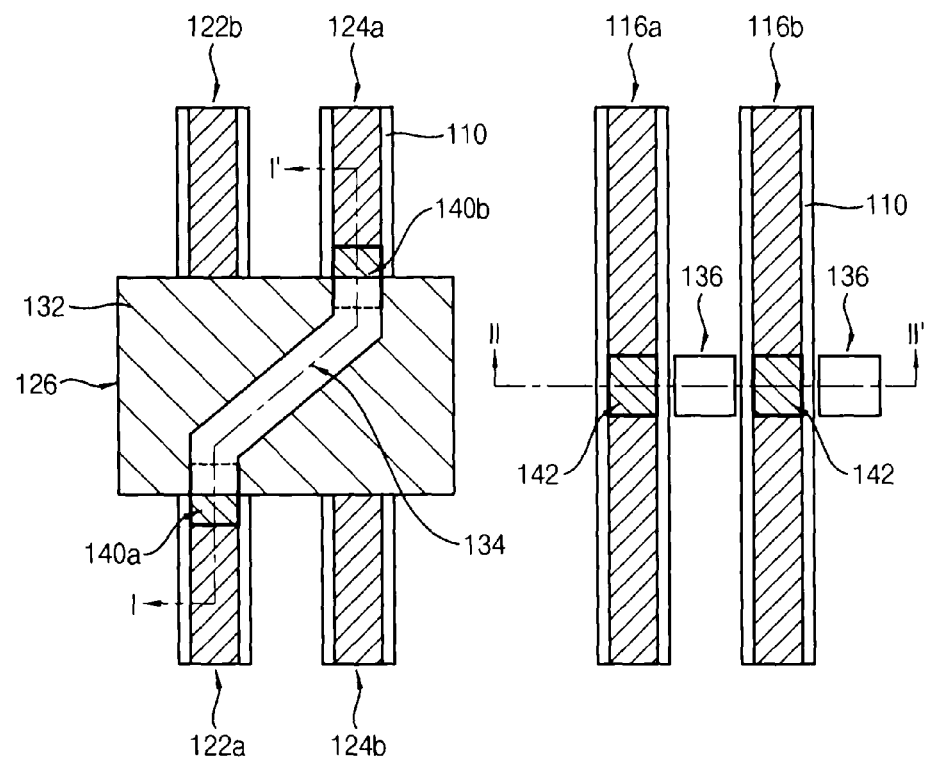
Figure 9B:
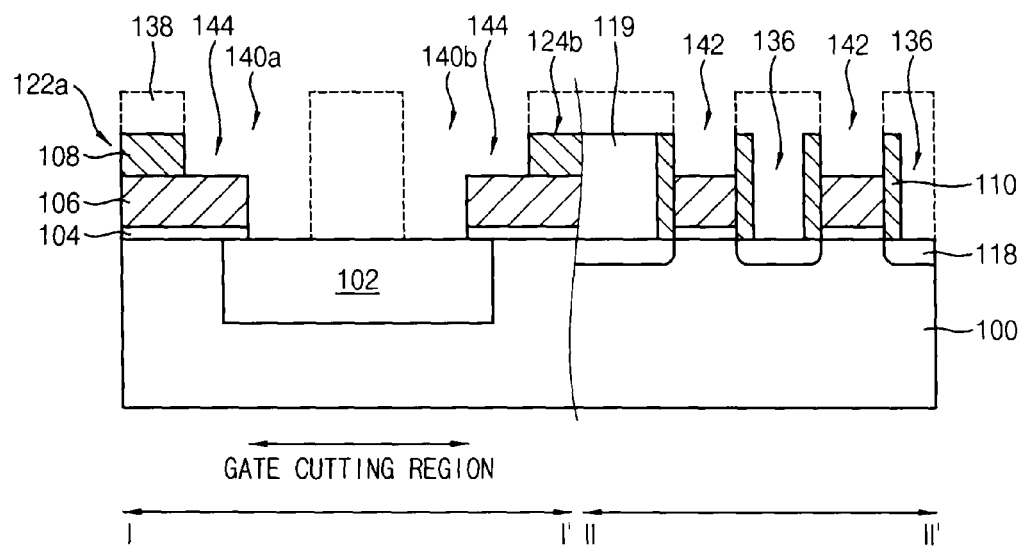

Referring to FIGS. 9A and 9B, upper portions of the insulation layer pattern 132 and the first, second, fifth and the sixth gate structures 122a, 124b, 116a and 116b may be etched using the third etching mask 138 to form the first, second and fourth contact holes 140a, 140b and 142, respectively.

The hard mask 108 adjacent to the first end portion of the first gate structure 122a may be etched to form the first contact hole 140a, and the first contact hole 140a and the second opening 134 may be in communication with each other. The hard mask 108 adjacent to the second end portion of the second gate structure 124b may be etched to form the second contact hole 140b, and the second contact hole 140b and the second opening 134 may be in communication with each other. The hard mask 108 of the fifth and sixth gate structures 116a and 116b may be etched to form the fourth contact holes 142. Thus, the gate electrodes 106 may be exposed by the first, second and fourth contact holes 140a, 140b and 142.

By performing the processes, the first and second contact holes 140a and 140b being in communication with the second opening 134 may be formed in the insulation layer pattern 132, and the third and fourth contact holes 136 and 142 may be formed in the insulating interlayer 119.

The third etching mask 138 may be removed.

Figure 10A:
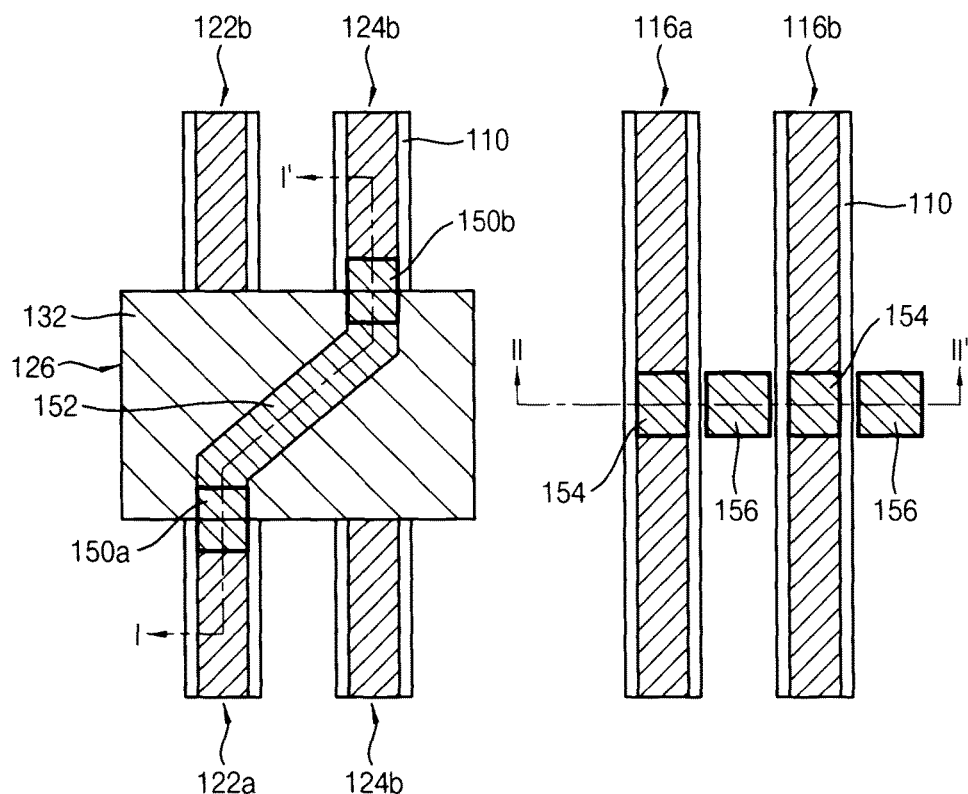
Figure 10B:
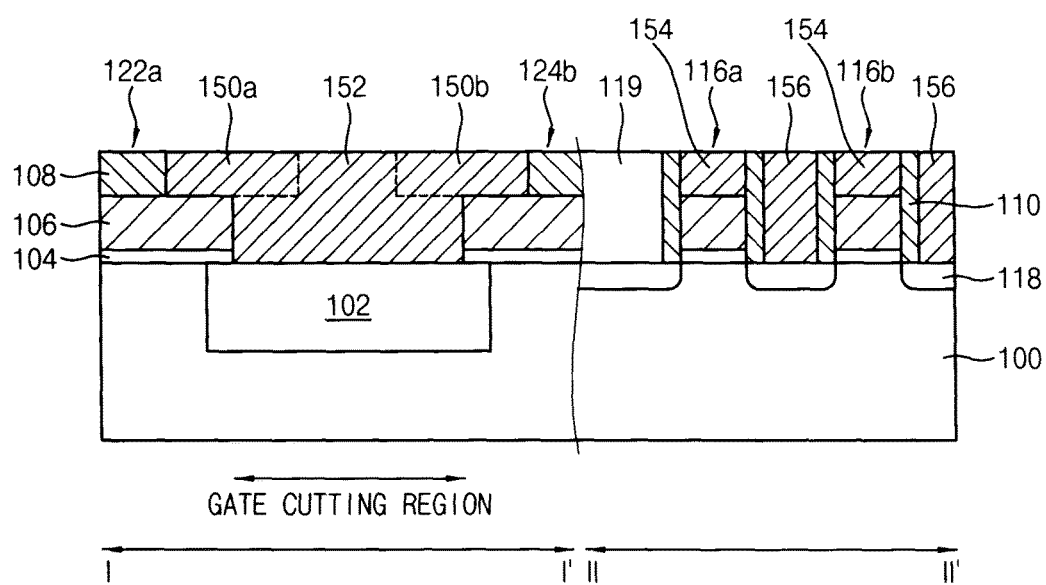

Referring to FIGS. 10A and 10B, a conductive layer may be formed on the insulation layer pattern 132, the insulating interlayer 119 and the first to sixth gate structures 122a, 124b, 122b, 124a, 116a and 116b to fill the second opening 134, the first to fourth contact holes 140a, 140b, 136 and 142. The conductive layer may be formed to include a metal having a low resistance, e.g., tungsten.

The conductive layer may be planarized until top surfaces of the first to sixth gate structures 122a, 124b, 122b, 124a, 116a and 116b may be exposed. In some example embodiments, the planarization process may be performed by a CMP process and/or an etch back process.

Thus, first to fourth contact plugs 150a, 140b, 146 and 154 may be formed in the first to fourth contact holes 140a, 140b, 136 and 142, respectively, and a cross-coupling pattern 152 may be formed in the second opening 134. The cross-coupling pattern 152 and the first and second contact plugs 150a and 150b may form a cross-coupling structure 153 for electrically connecting the first and second gate structures 122a and 124b to each other. That is, the cross-coupling structure 153 may electrically connect the gate electrodes 106 of the first and second gate structures 122a and 124b to each other.

The cross-coupling pattern 152 may contact sidewalls of the first and second end portions of the first and second gate structures 122a and 124b, respectively, and may contact the substrate 100.

The first contact plug 150a may directly contact an upper portion of a first end portion of the first gate structure 122a and a first upper sidewall of the cross-coupling pattern 152. The second contact plug 150b may directly contact an upper portion of a second end portion of the second gate structure 124b and a second upper sidewall of the cross-coupling pattern 152. The first and second contact plugs 150a and 150b may contact a top surface of the gate electrodes 106. That is, bottom surfaces of the first and second contact plugs 150a and 150b may be higher than a bottom surface of the cross-coupling pattern 152.

By performing the planarization process, the cross-coupling pattern 152, the insulation layer pattern 132, the insulating interlayer 119, the third and fourth contact plugs 156 and 154 and the first to sixth gate structures 122a, 124b, 122b, 124a, 116a and 116b may be formed to have top surfaces substantially coplanar with one another, and may be formed to have flat top surfaces. The top surfaces of the cross-coupling structure 153 and the third and fourth contact plugs 156 and 154 may not be higher than the top surfaces of the first to sixth gate structures 122a, 124b, 122b, 124a, 116a and 116b. Thus, parasitic capacitances due to the cross-coupling structure 153 and the third and fourth contact plugs 156 and 154 may decrease so that the semiconductor device may have a high speed.

The cross-coupling structure 153 and the third and fourth contact plugs 156 and 154 may be formed at the same time by a single deposition process and a single planarization process. Thus, the cross-coupling structure 153 and the third and fourth contact plugs 156 and 154 may be simply formed, and may include substantially the same conductive material.

As illustrated above, the semiconductor including the cross-coupling structure 153 may be manufactured.

Figure 11:
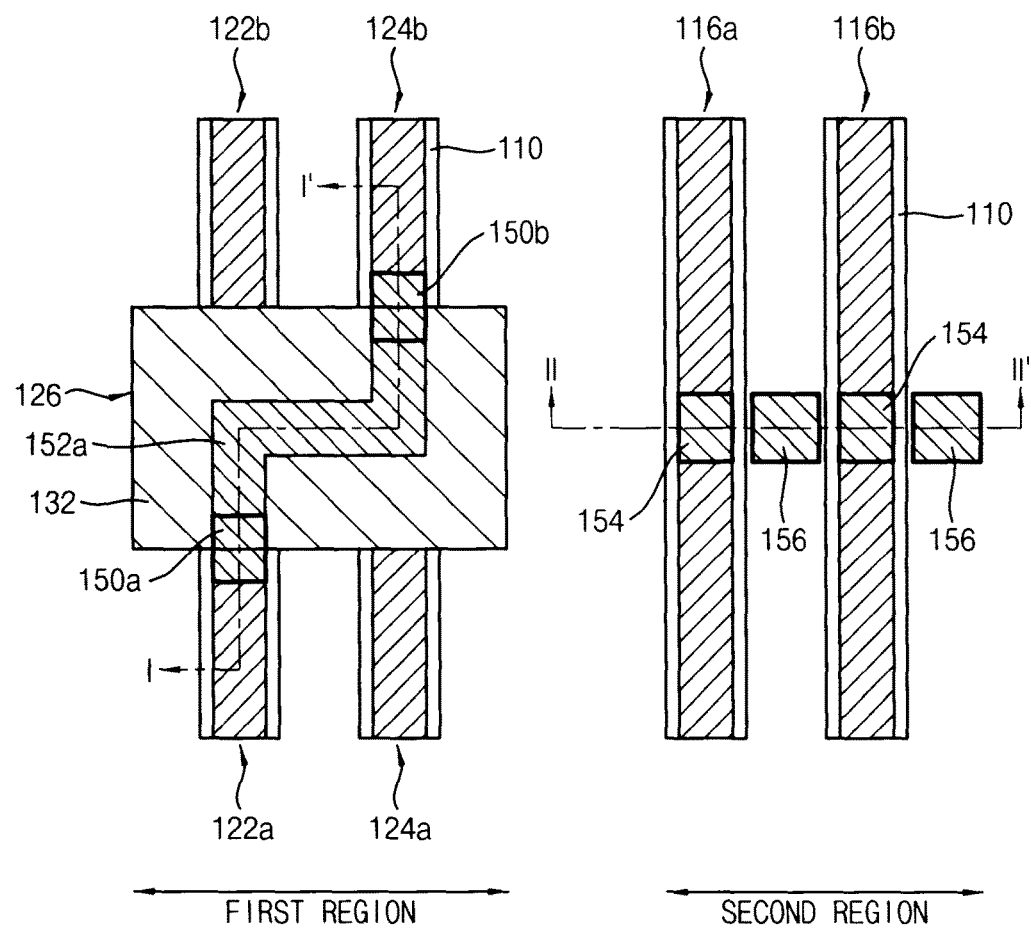

FIG. 11 is a plan view illustrating a semiconductor device in accordance with some example embodiments. The semiconductor device may be substantially the same as or similar to that illustrated in FIG. 1, except for a layout of the cross-coupling pattern. Cross-sections taken along lines I-I' and II-II', respectively, of FIG. 11 may be substantially the same as the cross-sections of FIG. 2.

Referring to FIG. 11, a cross-coupling structure may be formed in the gate cutting region 126, and may electrically connect the first and second gate structures 122a and 124b to each other. The cross-coupling structure may include a cross-coupling pattern 152a, a first contact plug 150a and a second contact plug 150b.

The cross-coupling pattern 152a may contact sidewalls of the first and second gate structures 122a and 124b, and may be disposed between the first and second gate structures 122a and 124b. Thus, the cross-coupling pattern 152a may be electrically connected to the first and second gate structures 122a and 124b The cross-coupling pattern 152a may include first, second and third portions. The first portion of the cross-coupling pattern 152a may contact a sidewall of the first end portion of the first gate structure 122a and may extend in a first direction, the second portion of the cross-coupling pattern 152a may contact the first portion and may extend in a second direction substantially perpendicular to the first direction, and the third portion of the cross-coupling pattern 152a may contact a sidewall of the second end portion of the second gate structure 124b, and may extend in the first direction. The first to third portions may be connected with one another.

The semiconductor device of FIG. 11 may be formed by performing processes substantially the same as or similar to those illustrated in FIGS. 3A to 10A and 3B to 10B. In the process illustrated in FIGS. 7A and 7B, an exposing portion of a second etching mask may be formed to have a shape substantially the same as the shape of the cross-coupling pattern 152a as shown in FIG. 11. By an etching process using the second etching mask, a second opening may be formed to have a shape substantially the same as the shape of the cross-coupling pattern 152a. Thus, as shown in FIG. 11, the cross-coupling pattern may be formed.

Figure 12:
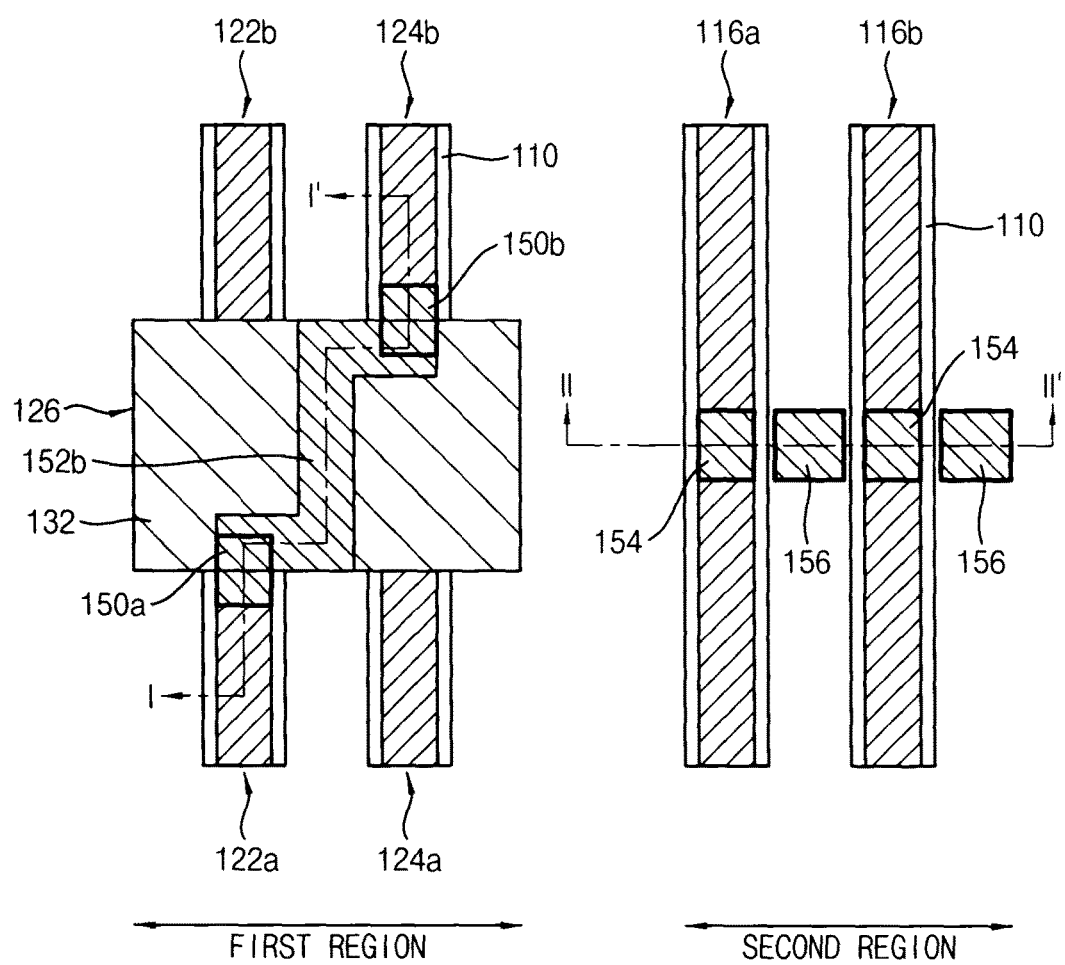

FIG. 12 is a plan view illustrating a semiconductor device in accordance with some example embodiments. The semiconductor device may be substantially the same as or similar to that illustrated in FIG. 1, except for a layout of the cross-coupling pattern. Cross-sections taken along lines I-I' and II-II', respectively, of FIG. 11 may be substantially the same as cross-sections of FIG. 2.

Referring to FIG. 12, a cross-coupling structure may be formed in the gate cutting region 126, and may electrically connect the first and second gate structures 122a and 124b to each other. The cross-coupling structure may include a cross-coupling pattern 152b, a first contact plug 150a and a second contact plug 150b.

The cross-coupling pattern 152b may contact sidewalls of the first and second gate structures 122a and 124b, respectively, and may be disposed between the first and second gate structures 122a and 124b. Thus, the cross-coupling pattern 152b may be electrically connected to the first and second gate structures 122a and 124b.

The cross-coupling pattern 152b may include first, second and third portions. The first portion of the cross-coupling pattern 152b may contact a sidewall of the first end portion of the first gate structure 122a and may extend in the second direction substantially perpendicular to the first direction, the second portion of the cross-coupling pattern 152b may contact the first portion and extend in the first direction, and the third portion of the cross-coupling pattern 152b may contact a sidewall of the second end portion of the second gate structure 124b and extend in the second direction. The first to third portions may be connected with one another.

In some example embodiments, the first portion may contact sidewalls of the first end portion of the gate electrode in the first gate structure 122a. The second portion may not contact sidewalls of the third and fourth gate structures 122b and 124a, and may extend in the first direction. The third portion may contact sidewalls of the second end portion of the gate electrode of the second gate structure 124b.

The semiconductor device of FIG. 12 may be formed by performing processes substantially the same as or similar to those illustrated in FIGS. 3A to 10A and 3B to 10B. In the process illustrated in FIGS. 7A and 7B, an exposing portion of a second etching mask may be formed to have a shape substantially the same as the shape of the cross-coupling pattern 152b as shown in FIG. 12. By an etching process using the second etching mask, a second opening may be formed to have a shape substantially the same as the shape of the cross-coupling pattern 152b. Thus, as shown in FIG. 12, the cross-coupling pattern 152b may be formed.

Figure 13:
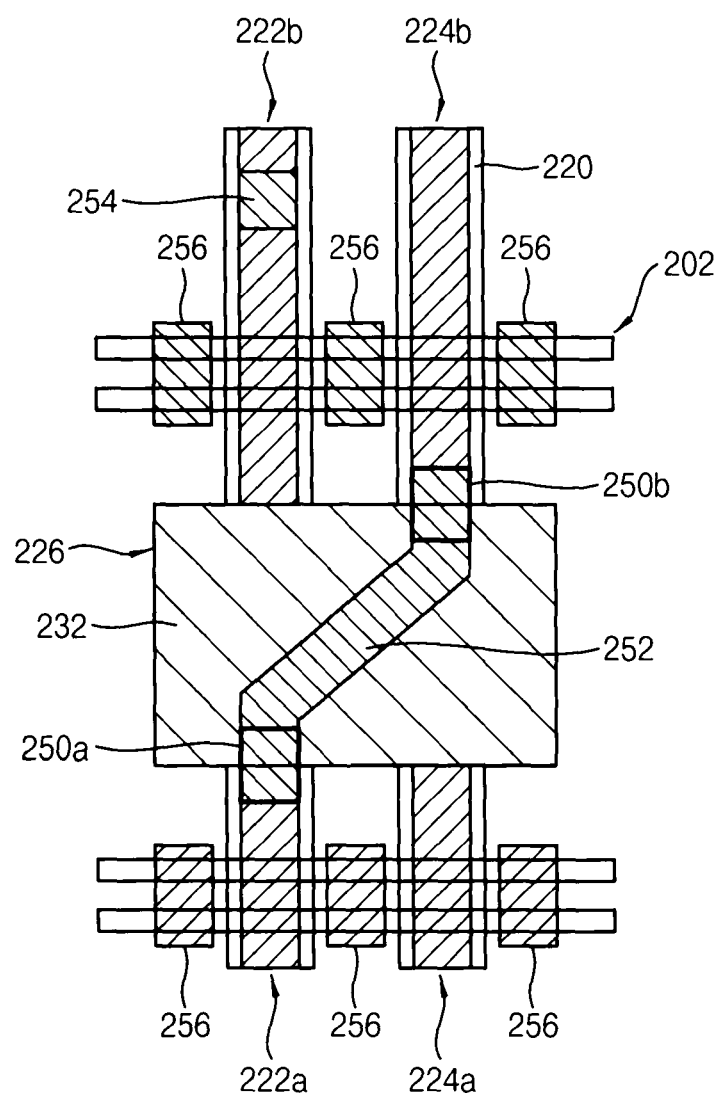

FIG. 13 is a plan view illustrating a semiconductor device in accordance with some example embodiments.

Referring to FIG. 13, a substrate may include an isolation pattern (not shown) and an active fin 202. The active fin 202 may protrude from a top surface of the isolation pattern. The active fin 202 may include a material substantially the same as the material of the substrate. Particularly, the active fin 202 may be formed by etching an upper portion of the substrate.

A plurality of active fins 202 may be disposed in a direction substantially perpendicular to an extension direction of each of gate structures 222a, 224b, 222b and 224a, which may be the first direction. That is, the active fins 202 may extend in the second direction.

The substrate may include a gate cutting region 226 on which no gate structure is formed. The active fins 202 may not be formed in the gate cutting region 226, and thus the isolation pattern 102 may be formed in the gate cutting region 126.

The end portion of each of the gate structures 222a, 224b, 222b and 224a may be disposed at an edge of the gate cutting region 126, and the gate structures 222a, 224b, 222b and 224a may be disposed at an outside of the gate cutting region 126.

Impurity regions (not shown) serving as source/drain regions may be formed at upper portions of the active fins 202 adjacent to the first to fourth gate structure 222a, 224b, 222b and 224a. In some example embodiments, an epitaxial layer pattern (not shown) may be further formed at sidewalls of the active fins 202, and thus the impurity regions in the active fins 202 may be connected to each other.

The first to fourth gate structures 222a, 224b, 222b and 224a may have first to fourth end portions, respectively, and each of the first to fourth end portions may be adjacent to the edge of the gate cutting region 126. Bottom surfaces of the first to fourth gate structures 222a, 224b, 222b and 224a may be disposed on the active fins 202, and thus may have a shape substantially the same as top surface profiles of the active fins 202. Top surfaces of the first to fourth gate structures 222a, 224b, 222b and 224a may be flat.

Each of the first to fourth gate structures 222a, 224b, 222b and 224a may include a gate insulation layer pattern (not shown) formed on the active fins 202, a gate electrode (not shown) having a substantially flat top surface, and a hard mask (not shown) sequentially stacked. Each of the first to fourth gate structures 222a, 224b, 222b and 224a may extend in the first direction.

Spacers 220 may be formed on sidewalls of the first to fourth gate structures 222a, 224b, 222b and 224a. In some example embodiments, the spacers 220 may not be formed on sidewalls of the first to fourth end portions of the first to fourth gate structures 222a, 224b, 222b and 224a, respectively.

A cross-coupling structure may be formed in the gate cutting region 226, and may be electrically connected to the first and second gate structures 222a and 224b spaced apart from each other in a diagonal direction with respect to the first direction. The cross-coupling structure may include a cross-coupling pattern 252 and first and second contact plugs 250a and 250b.

In some example embodiments, the cross-coupling pattern 252 may include first, second and third portions. The first portion of the cross-coupling pattern 252 may contact a sidewall of the first end portion of the first gate structure 222a and may extend in the first direction, the second portion of the cross-coupling pattern 252 may be bent to extend in a direction forming an acute angle with the first direction, and the third portion of the cross-coupling pattern 252 may contact a sidewall of the second end portion of the second gate structure 224b, and may extend in the first direction. The cross-coupling pattern 252 may be substantially the same as the cross-coupling pattern illustrated with reference to FIG. 2. In other example embodiments, the cross-coupling pattern 252 may have a shape substantially the same as the shape of FIG. 11 or 12.

An insulation layer pattern 232 may be formed on the substrate in the gate cutting region 226 surrounding the sidewall of the cross-coupling pattern 252. An insulating interlayer (not shown) may be formed on the substrate between the first to fourth gate structures 222a, 224b, 222b and 224a.

Top surfaces of the cross-coupling structure, the first to fourth gate structures 222a, 224b, 222b and 224a, the first and second contact plugs 250a and 250b, the insulation layer pattern 232, and the insulating interlayer may be substantially coplanar with one another, and may be flat.

A third contact plug 256 may be formed through the insulating interlayer and contact a portion of the impurity regions adjacent to the first to fourth gate structures 222a, 224b, 222b and 224a. If a fin-type transistor is formed at two active fins 202, the third contact plug 256 may be formed to contact impurity regions of both of the two active fins 202.

A fourth contact plug 254 may be formed through at least one of the hard masks of the first to fourth gate structures 222a, 224b, 222b and 224a, and contact at least one of the gate electrodes of the first to fourth gate structures 222a, 224b, 222b and 224a. The fourth contact plug 254 may be formed at an outside of the gate cutting region 226.

The third and fourth contact plugs 256 and 254 may be substantially coplanar with the top surfaces of the cross-coupling structure, the first to fourth gate structures 222a, 224b, 222b and 224a, the insulation layer pattern 232 and the insulating interlayer, and may be substantially flat.

As illustrated above, a height of the cross-coupling structure may decrease, and a parasitic capacitance due to the cross-coupling structure 153 may decrease so that the semiconductor device may have a high speed.

FIGS. 14 to 18 are plan views illustrating stages of a method of manufacturing a semiconductor device in accordance with some example embodiments.

Figure 14:
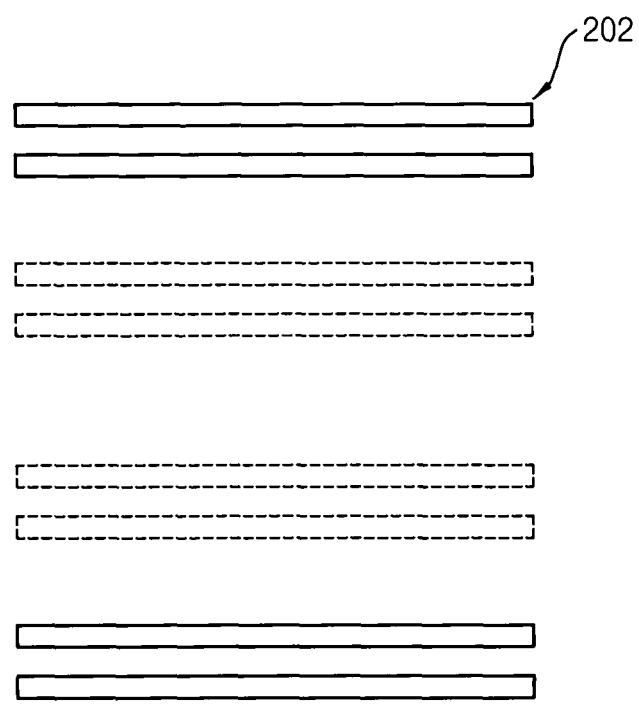

Referring to FIG. 14, active fins 202 and isolation pattern (not shown) may be formed on a substrate.

Particularly, an upper portion of the substrate may be partially etched to form preliminary active fins (not shown) and trench (not shown) therebetween. The preliminary active fins formed in a gate cutting region may be etched to form active fins 202. The active fins 202 may extend in the second direction, and may be spaced apart from each other in the first direction.

An insulation layer may be formed on the substrate to sufficiently fill the trench, and may be planarized until top surfaces of the active fins 202 may be exposed to form an isolation layer. An upper portion of the insulation layer may be removed to form an isolation pattern. The isolation layer may be formed to include an oxide, e.g., silicon oxide.

Figure 15:
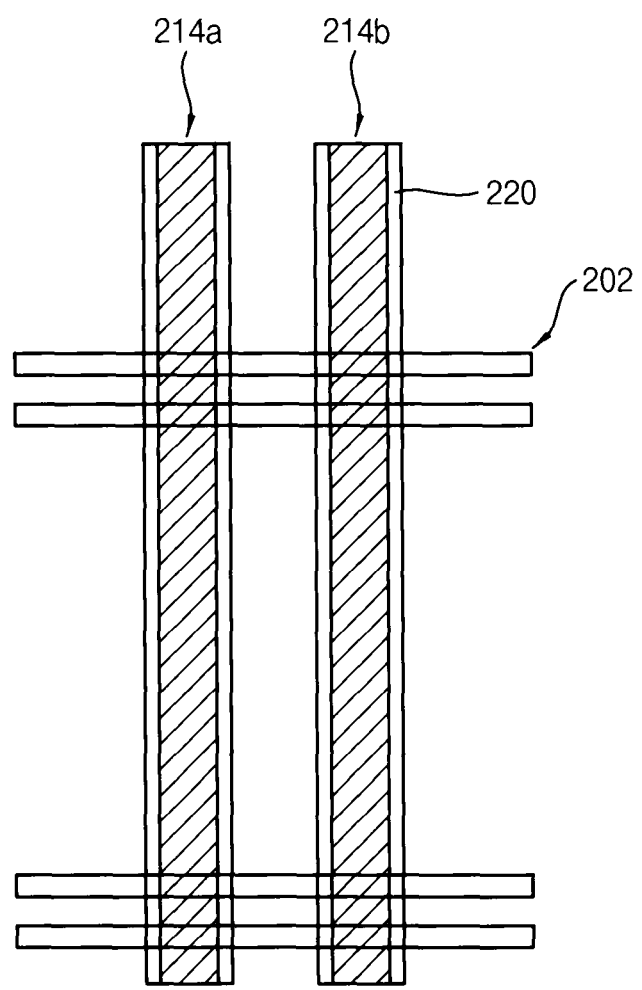

Referring to FIG. 15, first and second preliminary gate structures 214a and 214b may be formed on the substrate to extend in the first direction. Spacers 220 may be formed on sidewalls of the first and second preliminary gate structures 214a and 214b.

Particularly, a gate insulation layer (not shown), a gate electrode layer (not shown) and a gate mask layer (not shown) may be sequentially formed on the substrate, and the gate mask layer may be etched using a photoresist pattern (not shown) as etching mask to form a hard mask (not shown). The gate electrode layer and the gate insulation layer may be sequentially patterned using the hard mask as an etching mask to form the first and second preliminary gate structures 214a and 214b. Each of the first and second preliminary gate structures 214a and 214b may be formed to include a gate insulation pattern (not shown), a gate electrode (not shown), and the hard mask sequentially stacked.

A spacer layer may be formed on the first and second preliminary gate structures 214a and 214b and the substrate, and may be anisotropically etched. Thus, spacers 220 may be formed on sidewalls of the first and second preliminary gate structures 214a and 214b. The spacer layer may be formed include a nitride, e.g., silicon nitride.

Impurities may be doped into the substrate to form impurity regions (not shown) serving as source/drain regions at upper portions of the active fins 202 adjacent to the first and second preliminary gate structures 214a and 214b.

Figure 16:
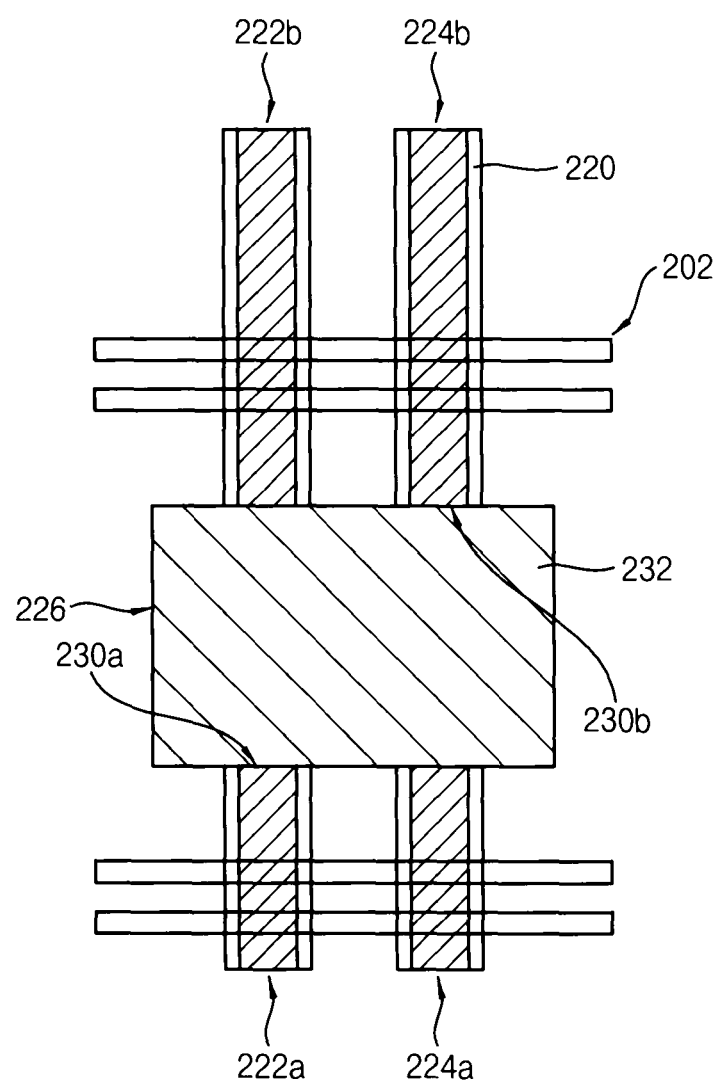

Referring to FIG. 16, an insulating interlayer (not shown) may be formed on the substrate to sufficiently cover the first and second preliminary gate structures 214a and 214b, and may be planarized until top surfaces of the first and second gate structures 214a and 214b may be exposed.

A first etching mask (not shown) exposing a gate cutting region 226 may be formed on the first and second preliminary gate structures 214a and 214b and the insulating interlayer. The gate cutting region 226 may have a rectangular shape in plan view, which may include portions of the first and second preliminary gate structures 214a and 214b.

The first and second preliminary gate structures 214a and 214b and the insulating interlayer may be etched using the first etching mask to form a first opening (not shown) having a rectangular shape in plan view. Further, the first preliminary gate structure 214a may be cut into two pieces, which may form the first gate structure 222a and the third gate structure 222b, respectively. A second preliminary gate structure may be cut into two pieces, which may form the second gate structure 224b and the fourth gate structure 224a, respectively. The first to fourth gate structures 222a, 224b, 222b and 224a may be disposed at an outside of the gate cutting region 226.

An insulation layer (not shown) may be formed on the insulating interlayer to fill the first opening. The insulation layer may be formed to include oxide, e.g., silicon oxide. The insulation layer may be planarized until top surfaces of the first to fourth gate structures 222a, 224b, 222b and 224a may be exposed to form an insulation layer pattern 232 on the substrate in the gate cutting region 226.

Figure 17:
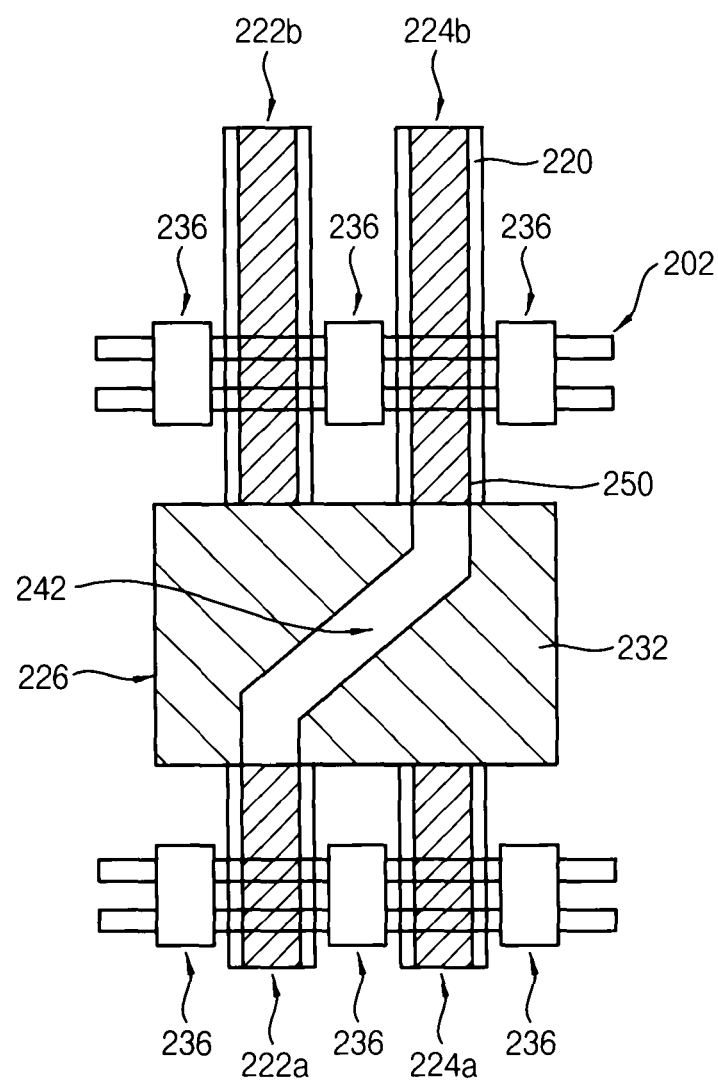

Referring to FIG. 17, a second etching mask (not shown) may be formed on the insulation layer pattern 232, the insulating interlayer, and the first to fourth gate structures 222a, 224b, 222b and 224a. The second etching mask may expose a portion for forming the cross-coupling pattern in the gate cutting region 226 and the impurity regions of the active fins 202.

The portion for forming the cross-coupling pattern exposed by the second etching mask may be formed to have a shape substantially the same as the shape of one of the cross-coupling patterns 152, 152a, 152b shown in FIGS. 1, 11 and 12.

The insulation layer pattern 232 and insulating interlayer may be etched using the second etching mask to form a second opening 242 exposing the portion for forming the cross-coupling pattern 252 and a third opening 236 exposing the impurity regions.

The second opening 242 may expose sidewalls of the first end portion 230a (refer to FIG. 16) of the first gate structure 222a and the second end portion 130b (refer to FIG. 16) of the second gate structure 224b. The third opening 236 may expose impurity regions of the active fins 202. The second etching mask may be removed.

Figure 18:
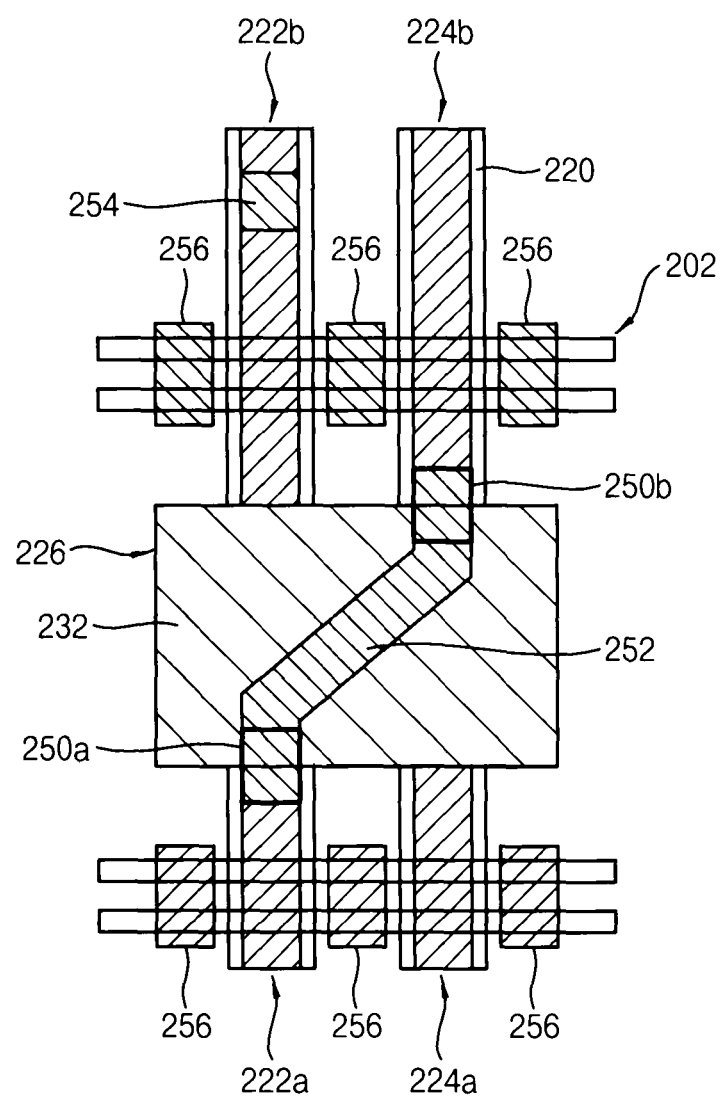

Referring to FIG. 18, a third etching mask (not shown) may be formed on the insulation layer pattern 232, the insulating interlayer, and the first to fourth gate structures 222a, 224b, 222b and 224a. The third etching mask 120 may expose a portion for forming first, second and fourth contact plugs 250a, 250b and 254.

Upper portion of the insulation layer pattern 232 and the gate structures 222a, 224b, 222b and 224a may be etched using the third etching mask to form the first, second and fourth contact holes (not shown), respectively.

The hard mask adjacent to the first end portion of the first gate structure 222a may be etched to form the first contact hole, and the first contact hole and the second opening 242 may be in communication with each other. The hard mask adjacent to the second end portion of the second gate structure 224b may be etched to form the second contact hole, and the second contact hole and the second opening 242 may be in communication with each other. At least one of the hard masks of the first to fourth gate structures 222a, 224b, 222b and 224a may be etched to form the fourth contact hole.

A conductive layer may be formed on the insulation layer pattern 232, the insulating interlayer and the first to fourth gate structures 222a, 224b, 222b and 224a to fill the second opening 242, the first to fourth contact holes. The conductive layer may be planarized until top surfaces of the first to fourth gate structures 222a, 224b, 222b and 224a may be exposed.

Thus, first to fourth contact plugs 250a, 250b, 256 and 254 may be formed in the first to fourth contact holes, respectively, and a cross-coupling pattern 252 may be formed in the second opening 242. The cross-coupling pattern 252 and first and second contact plugs 250a and 250b may serve as a cross-coupling structure for electrically connecting the first and second gate structures 222a and 224b to each other. The cross-coupling structure may be substantially the same as the cross-coupling illustrated with reference to FIG. 2.

As illustrated above, the semiconductor including the cross-coupling structure may be manufactured.

The above semiconductor device may be applied to various types of memory devices and/or systems including a gate structure. For example, the semiconductor device may be applied to logic devices such as central processing units (CPUs), main processing units (MPUs), or application processors (APs), etc. Additionally, the semiconductor device may be applied to gate structures of volatile memory devices such as DRAM devices or SRAM devices, or non-volatile memory devices such as flash memory devices, PRAM devices, MRAM devices, RRAM devices, etc.

The foregoing is illustrative of some example embodiments and is not to be construed as limiting thereof. Although a few example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A semiconductor device, comprising:
a first gate structure on a substrate, the first gate structure extending in a first direction and having a first end portion;
a second gate structure on the substrate, the second gate structure extending in the first direction and being spaced apart from the first gate structure, and the second gate structure having a second end portion opposite to the first end portion of the first gate structure in a diagonal direction with respect to the first direction;
a cross-coupling pattern between the first and second gate structures, the cross-coupling pattern contacting sidewalls of the first and second gate structures and electrically connecting the first and second gate structures to each other;
a first contact plug directly contacting an upper portion of the first end portion of the first gate structure and a first upper boundary of the cross-coupling pattern, the first contact plug extending in the first direction; and
a second contact plug directly contacting an upper portion of the second end portion of the second gate structure and a second upper boundary of the cross-coupling pattern, the second contact plug extending in the first direction;
wherein the substrate includes a gate cutting region having a substantially rectangular shape in plan view between first and second gate electrodes, wherein edges of the gate cutting region are adjacent to the first and second end portions of the first and second gate struc- tures, and wherein the cross-coupling pattern is confined within the edges of the gate cutting region.

2. The semiconductor device of claim 1, wherein top surfaces of the first and second gate structures, the cross-coupling pattern and the first and second contact plugs are substantially coplanar with one another.

3. The semiconductor device of claim 1, wherein a bottom surface of the cross-coupling pattern is on the substrate.

4. The semiconductor device of claim 1, wherein the substrate includes active fins, and wherein the first and second gate structures cross the active fins.

5. The semiconductor device of claim 1, wherein at least one of the first and second gate structures includes a gate insulation layer, a gate electrode and a hard mask in a sequentially stacked configuration, wherein the first contact plug is in contact with a sidewall of the hard mask and a top surface of the gate electrode of the first gate structure, and the second contact plug is in contact with a sidewall of the hard mask and a top surface of the gate electrode of the second gate.

6. The semiconductor device of claim 5, wherein top surfaces of the first and second contact plugs are substantially coplanar with top surfaces of the hard masks of the first and second gate structures.

7. The semiconductor device of claim 1, further comprising an insulation layer pattern in the gate cutting region surrounding sidewalls of the cross-coupling pattern.

8. The semiconductor device of claim 7, wherein the insulation layer pattern includes silicon oxide.

9. The semiconductor device of claim 1, further comprising:
a third gate structure extending in the first direction and being spaced apart from the first gate structure in the first direction; and
a fourth gate structure extending in the first direction and being spaced apart from the second gate structure in the first direction,
wherein at least one of the third and fourth gate structures is outside of the gate cutting region.

10. The semiconductor device of claim 1, further comprising spacers on sidewalls of the first and second gate electrodes, wherein at least one of the spacers extends in the first direction.

11. The semiconductor device of claim 1, wherein the cross-coupling pattern includes a first portion contacting a sidewall of the first end portion of the first gate structure and extending in a third direction, a third portion contacting a sidewall of the second end portion of the second gate structure and extending in the third direction, and a second portion between the first and third portions.

12. The semiconductor device of claim 1, wherein the cross-coupling pattern and the first and second contact plugs include substantially the same conductive material.

13. A semiconductor device, comprising:
a first gate structure including a first gate electrode and a first hard mask in a sequentially stacked configuration on a substrate, the first gate structure extending in a first direction having a first end portion at which the first gate structure is exposed by the first hard mask;
a second gate structure including a second gate electrode and a second hard mask in a sequentially stacked configuration on the substrate and being spaced apart from the first gate structure, the second gate structure having a second end portion where the second gate structure is exposed by the second hard mask, the second end portion of the second gate structure being opposite to the first end portion of the first gate structure in a diagonal direction;
a cross-coupling pattern between the first and second gate structures, the cross-coupling pattern contacting sidewalls of the first and second gate electrodes and electrically connecting the first and second gate structures to each other;
a first contact plug directly contacting a sidewall of the first hard mask, a top surface of the first gate electrode, and a first upper boundary of the cross-coupling pattern, the first contact plug extending in the first direction; and
a second contact plug directly contacting a sidewall of the second hard mask, a top surface of the second gate electrode, and a second upper boundary of the cross-coupling pattern, the second contact plug extending in the first direction;
wherein the substrate includes a gate cutting region having a substantially rectangular shape in plan view between the first and second gate electrode, wherein edges of the gate cutting region are adjacent to the first and second end portions of the first and second gate structures, and wherein the cross-coupling pattern is confined within the edges of the gate cutting region.

14. The semiconductor device of claim 13, further comprising a fifth gate structure and a sixth gate structure on a portion of the substrate spaced apart from the gate cutting region, wherein the fifth and sixth gate structures have stacked structures that are substantially the same as stacked structures of the first and second gate structures.

15. A semiconductor device, comprising:
a first gate and a second gate on a substrate the first and second gates extending in a first direction;
a cross-coupling pattern having first sidewalls and second sidewalls, the cross-coupling pattern being between the first and second gates, the first sidewalls of the cross-coupling pattern being in contact with corresponding sidewalls of the first and second gates;
a first contact plug in contact with a first boundary of the cross-coupling pattern, the first contact plug extending in the first direction;
a second contact plug in contact with a second boundary of the cross-coupling pattern, the second contact plug extending in the first direction;
the first contact plug overlapping at least a portion of the first gate and one of the first sidewalls of the cross-coupling pattern;
the second contact plug overlapping at least a portion of the second gate and another of the first sidewalls of the cross-coupling pattern; and
a surface of the cross-coupling pattern being substantially co-planar with surfaces of the first and second contact plugs;
wherein the substrate includes a gate cutting region having a substantially rectangular shape in plan view between first and second gate electrodes, wherein edges of the gate cutting region are adjacent to first and second end portions of the first and second gates, and wherein the cross-coupling pattern is confined within the edges of the gate cutting region.

16. The semiconductor device of claim 15, wherein
the first gate is overlapped by a portion of the first contact plug and a first hard mask; and
the second gate is overlapped by a portion of the second contact plug and a second hard mask.

17. The semiconductor device of claim 15, wherein the cross-coupling pattern is on an isolation pattern.

18. The semiconductor device of claim 17, further comprising:
- a first gate insulation pattern between the first gate and the substrate; and
- a second gate insulation pattern between the second gate and the substrate;
- the first and second gate insulation patterns overlapping at least a portion of the isolation pattern and a portion of the substrate.

* * * * *